(12) United States Patent
Fukuhara

(10) Patent No.: US 7,936,376 B2
(45) Date of Patent: May 3, 2011

(54) IMAGE PICKUP DEVICE, INTEGRATED CIRCUIT OF IMAGE PICKUP ELEMENT, AND IMAGE PICKUP RESULT PROCESSING METHOD

(75) Inventor: Takahiro Fukuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 743 days.

(21) Appl. No.: 11/632,317

(22) PCT Filed: Jun. 22, 2005

(86) PCT No.: PCT/JP2005/011889
§ 371 (c)(1),
(2), (4) Date: Feb. 20, 2008

(87) PCT Pub. No.: WO2006/006398
PCT Pub. Date: Jan. 19, 2006

(65) Prior Publication Data
US 2009/0002507 A1    Jan. 1, 2009

(30) Foreign Application Priority Data
Jul. 13, 2004   (JP) ................................ 2004-205381

(51) Int. Cl.
*H04N 5/228* (2006.01)
*G06K 9/36* (2006.01)
*G06K 9/46* (2006.01)
(52) U.S. Cl. ...................... 348/222.1; 382/239; 382/232
(58) Field of Classification Search ................. 348/222.1
See application file for complete search history.

(56) References Cited

U.S. PATENT DOCUMENTS

| 6,065,094 | A  | * | 5/2000 | Akiyama ...................... 711/112 |
| 7,016,546 | B2 | * | 3/2006 | Fukuhara et al. ............. 382/239 |
| 7,369,161 | B2 | * | 5/2008 | Easwar et al. ............. 348/222.1 |
| 2001/0024530 | A1 | * | 9/2001 | Fukuhara et al. ............. 382/240 |
| 2002/0171743 | A1 | * | 11/2002 | Kimizuka et al. .......... 348/222.1 |
| 2003/0214595 | A1 | * | 11/2003 | Mabuchi ........................ 348/294 |

FOREIGN PATENT DOCUMENTS

| JP | 58-92260   | 6/1983  |
| JP | 63-174356  | 7/1988  |
| JP | 3-101385   | 4/1991  |
| JP | 5-268535   | 10/1993 |
| JP | 2001-94888 | 4/2001  |
| JP | 2004-31785 | 1/2004  |

\* cited by examiner

*Primary Examiner* — Sinh Tran
*Assistant Examiner* — Christopher K Peterson
(74) *Attorney, Agent, or Firm* — Finnegan, Henderson, Farabow, Garrett & Dunner, L.L.P.

(57) ABSTRACT

The present invention is applied to for example video cameras recording an image pickup result by moving picture, electronic still cameras, monitoring devices and the like. Image pickup means 3 and image compressing means 6 are connected to each other by a wiring layer formed on a surface on an opposite side from an image pickup surface of the image pickup means 3, and are thereby integrated with each other. A data compression ratio used for data compression of at least a next block is changed on the basis of an amount of code generated by data compression of an image pickup result S1 in a block unit. Also, the image pickup result S1 of each photoelectric conversion unit is output from the image pickup means 3 in such a manner as to correspond to the processing in the block unit.

17 Claims, 13 Drawing Sheets

FIG. 1

| | CCD | CMOS |
|---|---|---|
| BASIC STRUCTURE | SERIAL IMAGE OUTPUT DEVICE (PASSIVE SENSOR) | MULTI-ARRAY CCD (ACTIVE SENSOR) |
| MOST SIGNIFICANT FEATURE | SINGLE FUNCTION | MULTIFUNCTION AND HIGH FUNCTIONALITY |
| READING SYSTEM | SERIAL (THERE IS LIMITATION IN READING) | X-Y ADDRESS (HIGH DEGREE OF FREEDOM IN READING) |
| CHARACTERISTICS BETWEEN PIXELS | HIGH UNIFORMITY BETWEEN PIXELS | THERE IS CHARACTERISTIC DIFFERENCE BETWEEN PIXELS |
| HIGH SPEED | DIFFICULT TO ATTAIN CONTINUOUS HIGH SPEED | EASY TO ATTAIN CONTINUOUS HIGH SPEED |
| ACCUMULATION TIME AND END TIME | SIMULTANEOUS IN ALL PIXELS | DIFFERENT TIMES IN COLUMN OR PIXEL UNITS IN PRINCIPLE |
| POWER CONSUMPTION | HIGH | LOW |

FIG.6

| B1 | B2 | B3 | B4 | B5 |
|----|----|----|----|----|
| B6 | B7 | | | |

IMAGE PICKUP DEVICE, INTEGRATED CIRCUIT OF IMAGE PICKUP ELEMENT, AND IMAGE PICKUP RESULT PROCESSING METHOD

BACKGROUND OF THE INVENTION

1. Technical Field

The present invention relates to an image pickup device, an integrated circuit of an image pickup element, and an image pickup result processing method, and is applicable to for example video cameras recording an image pickup result by moving picture, electronic still cameras, monitoring devices and the like. The present invention connects and thereby integrates image pickup means and image compressing means with each other by a wiring layer formed on a surface on an opposite side from an image pickup surface of image pickup means, changes a data compression ratio used for data compression of at least a next block on the basis of an amount of code generated by data compression of image pickup results in a block unit, and outputs an image pickup result of each photoelectric conversion unit from the image pickup means in such a manner as to correspond to the processing in a block unit, whereby it is possible to make effective use of a high degree of freedom of reading image pickup results, which is a feature of a CMOS solid-state image pickup element or the like, simplify a general configuration, and reliably perform rate control.

2. Background Art

A video camera in related art buffers an image pickup result output from a CCD (Charge Coupled Device) solid-state image pickup element in a frame memory, and data-compresses the image pickup result in block units by an MPEG (Moving Picture Experts Group) method. In this MPEG2, rate control is performed by for example a method of TM5 (Test Mode 5) or the like. Similarly, an electronic still camera buffers an image pickup result output from a CCD solid-state image pickup element in a frame memory, data-compresses the image pickup result in block units by a JPEG (Joint Photographic Coding Experts Group) method, and performs rate control as in MPEG2.

On the other hand, CMOS solid-state image pickup elements have recently been put to practical use. As shown in FIG. 1 by contrast with the CCD solid-state image pickup element, the CMOS solid-state image pickup element has various features. For example, with the CCD solid-state image pickup element, times of a start and an end of charge accumulation are the same in all pixels, whereas with the CMOS solid-state image pickup element, times of a start and an end of charge accumulation are different in column or pixel units.

In particular, as shown in FIG. 2, the CCD solid-state image pickup element reads image pickup results of respective pixels by serial transmission. On the other hand, as shown in FIG. 3, the CMOS solid-state image pickup element can read image pickup results of respective pixels by X-Y address control, and thus has a high degree of freedom of reading image pickup results as compared with the CCD solid-state image pickup element. FIG. 2 is a schematic diagram showing output of image pickup results from the CCD solid-state image pickup element. An accumulated charge retained in each pixel is transferred to a vertical transfer register. The CCD solid-state image pickup element sequentially transfers the accumulated charge transferred to the vertical transfer register to a horizontal transfer register, and sequentially transfers and outputs the accumulated charge by the horizontal transfer register. On the other hand, FIG. 3 is a schematic diagram of output of image pickup results from the CMOS solid-state image pickup element, representing a case where image pickup results of respective pixels are sequentially output in column line units. In this case, the image pickup results can be output in a simultaneous and parallel manner in units equal in number to column lines.

Specifically, the CMOS solid-state image pickup element selectively turns on a MOSFET provided in each pixel by a horizontal address line extending in a horizontal direction and a vertical address line extending in a vertical direction, whereby an image pickup result is output to a signal line from the pixel selected by the horizontal address line and the vertical address line. Thus, in the example shown in FIG. 3, a plurality of pixels contiguous in the vertical direction share a signal line formed by one column line. By sequentially changing settings of horizontal address lines for the plurality of pixels connected to one column line and thereby sequentially turning on MOSFETs provided in the plurality of pixels, the column line is allocated to the pixels contiguous in the vertical direction by time division, and image pickup results of these pixels are output. As viewed in the horizontal direction, pixels contiguous in the horizontal direction share a horizontal address line. Such time-division allocation of pixels contiguous in the vertical direction to a column line is performed in pixels contiguous in the horizontal direction in a simultaneous and parallel manner, whereby image pickup results are output in line units.

A constitution in which such a CMOS solid-state image pickup element is integrated with a peripheral circuit is proposed in Japanese Patent Laid-open No. 2004-31785, for example.

On the other hand, various coding methods using a wavelet transform process have recently been proposed as coding systems for processing such image data. In the wavelet transform process, the image data is band-divided and down-sampled into a high-frequency component and a low-frequency component in each of a horizontal direction and a vertical direction, whereby the image data is divided into four subbands. There are for example a case where as shown in FIG. 4(A), the image data is processed by four subbands HH, HL, LH, and LL by performing such a dividing process only once, and a case where as shown in FIG. 4(B), the image data is processed by repeating the band dividing process. Incidentally, FIG. 4(B) represents a case where the band dividing process is repeated three times. In this example, of the subbands HH, HL, LH, and LL, the subband LL of low frequencies in the horizontal direction and the vertical direction is further subjected to the band dividing process to generate four subbands LLHH, LLHL, LLLH, and LLLL. Of the subbands LLHH, LLHL, LLLH, and LLLL, the subband LLLL of low frequencies in the horizontal direction and the vertical direction is further subjected to the band dividing process to generate four subbands LLLLHH, LLLLHL, LLLLLH, and LLLLLL.

Proposed as a coding process based on such a wavelet transform process are a so-called line-based wavelet transform in which image data is processed in line units and a so-called tile-based wavelet transform in which image data is processed in tile units as rectangular blocks set by dividing one screen.

It is considered that when the high degree of freedom of reading image pickup results, which is a feature of a CMOS solid-state image pickup element, can be utilized effectively, it is possible to further simplify the general configuration of the image pickup device, and perform rate control reliably.

DISCLOSURE OF INVENTION

The present invention has been made in view of the above, and proposes an image pickup device, an integrated circuit of an image pickup element, and an image pickup result processing method that make it possible to make effective use of the high degree of freedom of reading image pickup results, which is a feature of a CMOS solid-state image pickup element or the like, simplify the general configuration, and reliably perform rate control.

In order to solve such problems, the present invention is applied to an image pickup device including: image pickup means for outputting image pickup results by XY address control, the image pickup means including a plurality of photoelectric conversion units arranged in a form of a matrix; and a peripheral circuit retained integrally with the image pickup means, the peripheral circuit being connected to the photoelectric conversion units by a wiring layer formed on a surface on an opposite side from a light receiving surface of the image pickup means; the image pickup results of the image pickup means being processed and output by the peripheral circuit, wherein the peripheral circuit includes image compressing means for data-compressing and outputting at least the image pickup results in each predetermined processing unit, and controlling means for controlling a data compression ratio of the image compressing means, the peripheral circuit is supplied with the image pickup results from the image pickup means in units of blocks formed by dividing an effective image area in a horizontal direction and a vertical direction, and sequentially data-compresses the image pickup results, and within one frame, on a basis of an amount of code generated by data compression of one block by the image compressing means, the peripheral circuit changes the data compression ratio when at least a next block is data-compressed by the image compressing means, and the image pickup means outputs the image pickup results of the photoelectric conversion units with the blocks as units in a sequence corresponding to the data compression by the image compressing means.

In the image pickup device with a constitution according to the present invention, the image pickup device including image pickup means for outputting image pickup results by XY address control, the image pickup means including a plurality of photoelectric conversion units arranged in a form of a matrix, and a peripheral circuit retained integrally with the image pickup means, the peripheral circuit being connected to the photoelectric conversion units by a wiring layer formed on a surface on an opposite side from a light receiving surface of the image pickup means, the image pickup results of the image pickup means being processed and output by the peripheral circuit, the photoelectric conversion units of the image pickup means and the peripheral circuit are connected to each other by the wiring layer formed on the surface on the opposite side from the light receiving surface. Thus, the photoelectric conversion units and the peripheral circuit can be connected to each other with a high degree of freedom by effectively avoiding various inconveniences when the wiring layer is provided on the side of the light receiving surface. It is thereby possible to supply the image pickup results of the image pickup means to the peripheral circuit in various modes without impairing a high degree of freedom of the image pickup means in reading the image pickup results. Presupposing this constitution, according to the configuration of the present invention, the peripheral circuit includes image compressing means for data-compressing and outputting at least the image pickup results in each predetermined processing unit, and controlling means for controlling a data compression ratio of the image compressing means, the peripheral circuit is supplied with the image pickup results from the image pickup means in units of blocks formed by dividing an effective image area in a horizontal direction and a vertical direction, and sequentially data-compresses the image pickup results, and within one frame, on a basis of an amount of code generated by data compression of one block by the image compressing means, the peripheral circuit changes the data compression ratio when at least a next block is data-compressed by the image compressing means, and the image pickup means outputs the image pickup results of the photoelectric conversion units with the blocks as units in a sequence corresponding to the data compression by the image compressing means. Then, the image pickup results of the image pickup means are directly input to the image compressing means to be subjected to data compression, and rate control can be performed reliably. It is thereby possible to make effective use of the high degree of freedom of the image pickup means in reading the image pickup results, simplify the general configuration, and reliably perform rate control.

In addition, the present invention is applied to an integrated circuit of an image pickup element including: image pickup means for outputting image pickup results by XY address control, the image pickup means including a plurality of photoelectric conversion units arranged in a form of a matrix; and a peripheral circuit retained integrally with the image pickup means, the peripheral circuit being connected to the photoelectric conversion units by a wiring layer formed on a surface on an opposite side from a light receiving surface of the image pickup means; the image pickup results of the image pickup means being processed and output by the peripheral circuit, wherein the peripheral circuit includes image compressing means for data-compressing and outputting at least the image pickup results in each predetermined processing unit, and controlling means for controlling a data compression ratio of the image compressing means, the peripheral circuit is supplied with the image pickup results from the image pickup means in units of blocks formed by dividing an effective image area in a horizontal direction and a vertical direction, and sequentially data-compresses the image pickup results, and within one frame, on a basis of an amount of code generated by data compression of one block by the image compressing means, the peripheral circuit changes the data compression ratio when at least a next block is data-compressed by the image compressing means, and the image pickup means outputs the image pickup results of the photoelectric conversion units with the blocks as units in a sequence corresponding to the data compression by the image compressing means.

Thus, according to the constitution of the present invention, an integrated circuit of an image pickup element can be provided which makes it possible to make effective use of a high degree of freedom of reading image pickup results, which is a feature of a CMOS solid-state image pickup element or the like, simplify the general configuration, and reliably perform rate control.

In addition, the present invention is applied to a method of processing image pickup results in an image pickup device, the image pickup device including image pickup means for outputting image pickup results by XY address control, the image pickup means including a plurality of photoelectric conversion units arranged in a form of a matrix, and a peripheral circuit retained integrally with the image pickup means, the peripheral circuit being connected to the photoelectric conversion units by a wiring layer formed on a surface on an opposite side from a light receiving surface of the image pickup means, the image pickup results of the image pickup means being processed and output by the peripheral circuit, the method including: an image pickup result outputting step of outputting the image pickup results of the photoelectric conversion units from the image pickup means to the peripheral circuit; an image compressing step of data-compressing and outputting at least the image pickup results in each predetermined processing unit by the peripheral circuit; and a controlling step of controlling a data compression ratio of the image compressing step, wherein in the image compressing step, the image pickup results are input from the image pickup means in units of blocks formed by dividing an effective image area in a horizontal direction and a vertical direction, and sequentially data-compressed, in the controlling step, within one frame, on a basis of an amount of code generated by data compression of one block by the image compressing step, the data compression ratio when at least a next block is data-compressed by the image compressing step is changed, and in the image pickup result outputting step, the image pickup results of the photoelectric conversion units are output with the blocks as units in a sequence corresponding to the data compression by the image compressing step.

Thus, according to the constitution of the present invention, an image pickup result processing method can be provided which makes it possible to make effective use of a high degree of freedom of reading image pickup results, which is a feature of a CMOS solid-state image pickup element or the like, simplify the general configuration, and reliably perform rate control.

In addition, the present invention is applied to a method of processing image pickup results in an integrated circuit of an image pickup element, the integrated circuit of the image pickup element including image pickup means for outputting image pickup results by XY address control, the image pickup means including a plurality of photoelectric conversion units arranged in a form of a matrix, and a peripheral circuit retained integrally with the image pickup means, the peripheral circuit being connected to the photoelectric conversion units by a wiring layer formed on a surface on an opposite side from a light receiving surface of the image pickup means, the image pickup results of the image pickup means being processed and output by the peripheral circuit, the method including: an image pickup result outputting step of outputting the image pickup results of the photoelectric conversion units from the image pickup means to the peripheral circuit; an image compressing step of data-compressing and outputting at least the image pickup results in each predetermined processing unit by the peripheral circuit; and a controlling step of controlling a data compression ratio of the image compressing step, wherein in the image compressing step, the image pickup results are input from the image pickup means in units of blocks formed by dividing an effective image area in a horizontal direction and a vertical direction, and sequentially data-compressed, in the controlling step, within one frame, on a basis of an amount of code generated by data compression of one block by the image compressing step, the data compression ratio when at least a next block is data-compressed by the image compressing step is changed, and in the image pickup result outputting step, the image pickup results of the photoelectric conversion units are output with the blocks as units in a sequence corresponding to the data compression by the image compressing step.

Thus, according to the constitution of the present invention, an image pickup result processing method can be provided which makes it possible to make effective use of a high degree of freedom of reading image pickup results, which is a feature of a CMOS solid-state image pickup element or the like, simplify the general configuration, and reliably perform rate control.

According to the present invention, it is possible to make effective use of a high degree of freedom of reading image pickup results, which is a feature of a CMOS solid-state image pickup element or the like, simplify general configuration, and reliably perform rate control.

BRIEF DESCRIPTION OF DRAWINGS

FIG. 1 is a chart showing comparisons of image pickup elements.

FIG. 6 is a plan view of assistance in explaining a data compression process in the image pickup device of FIG. 5.

BEST MODE FOR CARRYING OUT THE INVENTION

Figure 2:
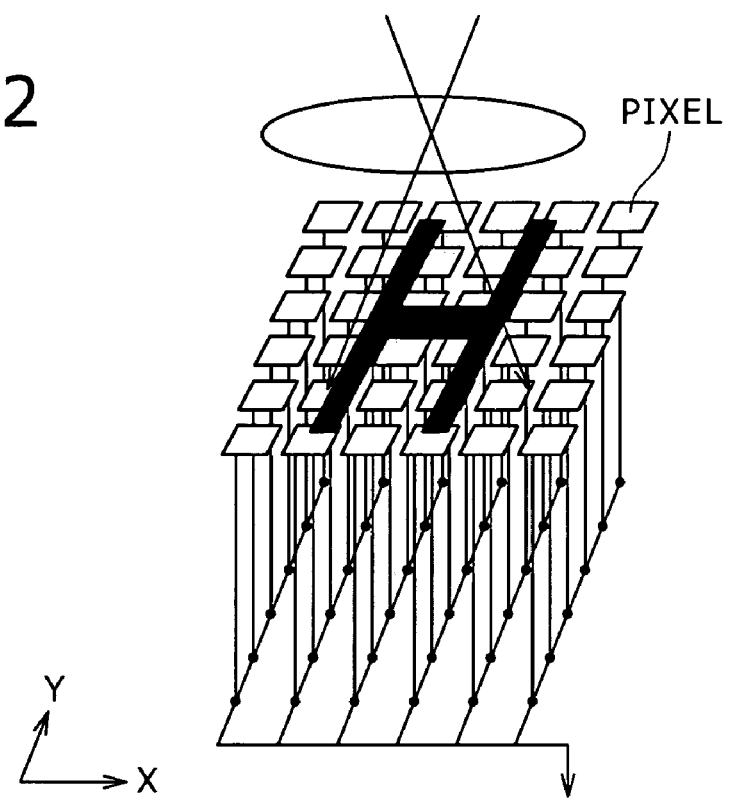
FIG. 2 is a schematic diagram showing output by a CCD solid-state image pickup element.

Embodiments of the present invention will hereinafter be described in detail, referring to the drawings as required.

(1) Configuration of First Embodiment

Figure 5:
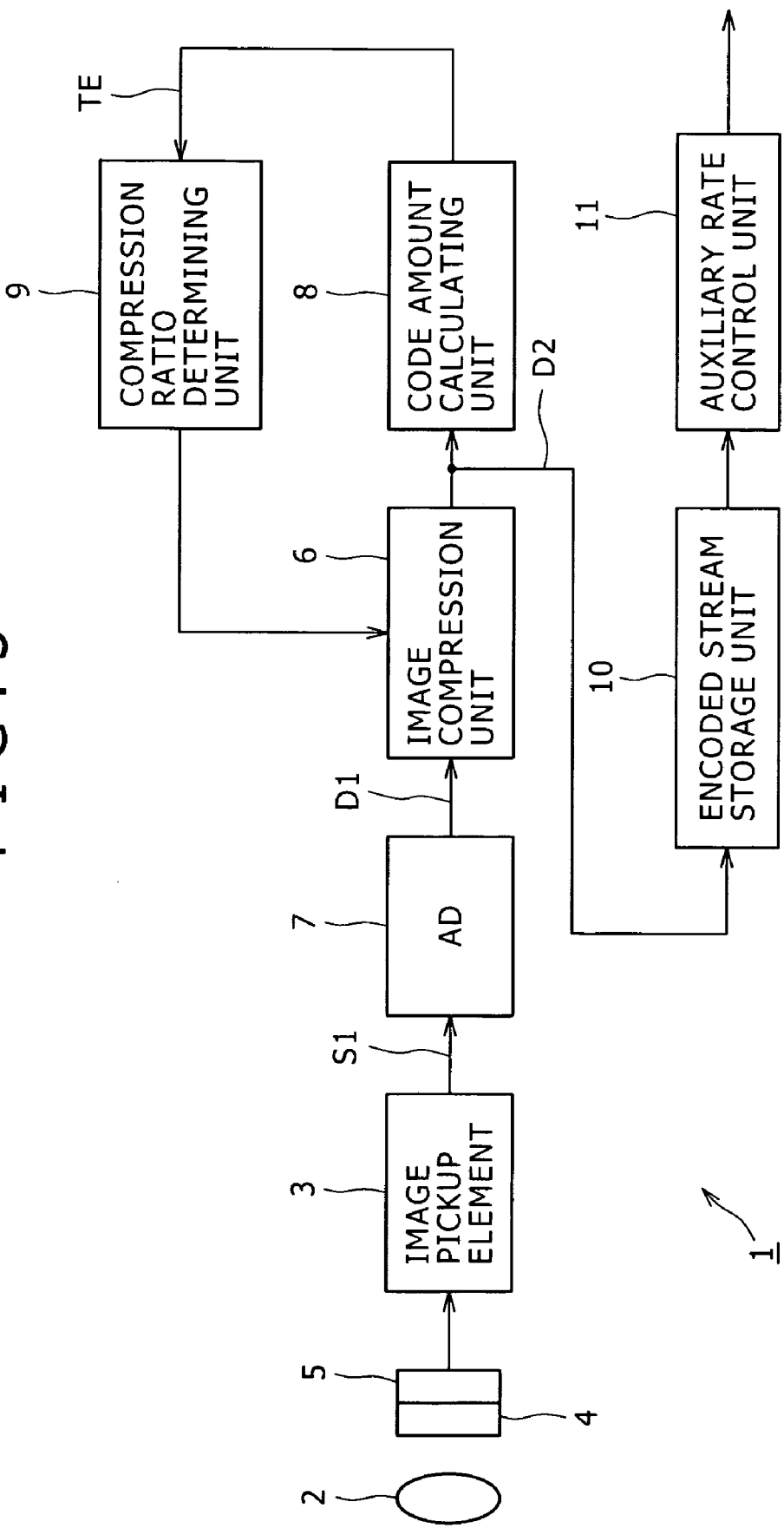
FIG. 5 is a block diagram showing an image pickup device according to a first embodiment of the present invention.

FIG. 5 is a block diagram showing an image pickup device according to a first embodiment of the present invention. The image pickup device 1 data-compresses a result of picking up an image of a desired subject, and records the result on a recording medium or sends out the result to a desired transmission destination.

A lens 2 in the image pickup device 1 varies a zoom magnification and a diaphragm in response to an operation by a user, and condenses incident light on an image pickup surface of an image pickup element 3. An optical low-pass filter 4 suppresses a high spatial frequency component from outgoing light from the lens 2. A following color correction filter 5 corrects the color temperature of outgoing light emitted from the optical low-pass filter 4, and then emits the light.

The image pickup element 3 is formed by a CMOS solid-state image pickup element, for example. The image pickup element 3 operates on various timing signals output from a driving unit not shown in the figure to subject an optical image formed on the image pickup surface to photoelectric conversion by pixels, and outputs an image pickup signal S1. In this series of processes, photoelectric conversion units forming the respective pixels in the image pickup element 3 are divided into areas corresponding to a processing unit of an image compression unit 6 in a following stage, and a period for outputting image pickup results is sequentially assigned to each division. In a period other than the period for outputting image pickup results, photoelectric conversion units belonging to each division each subject incident light to the photoelectric conversion process and store a photoelectric conversion result.

Figure 6:
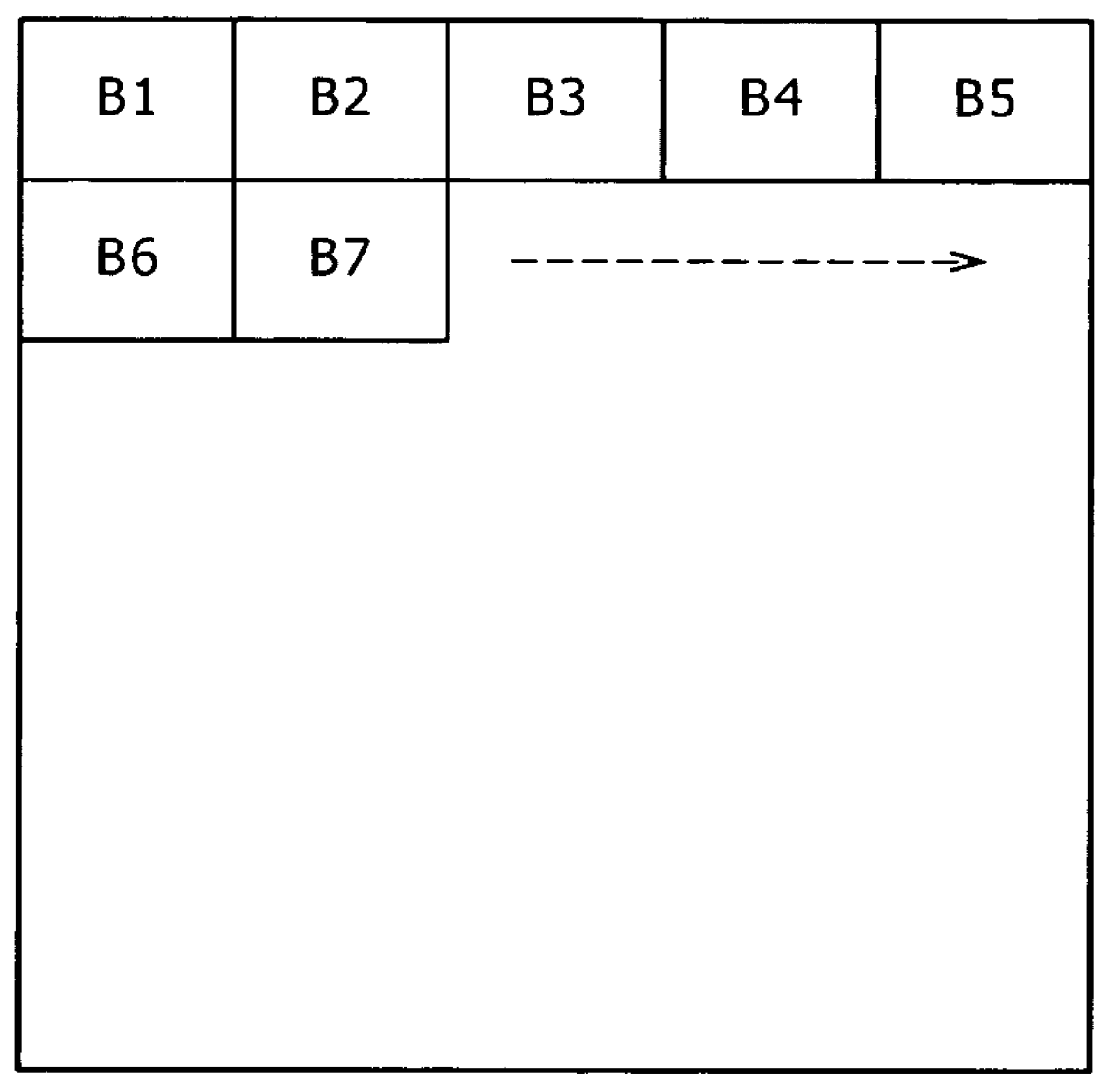

In the present embodiment, as shown in FIG. 6, with blocks B1, B2, B3, . . . formed by dividing image pickup results of the image pickup element 3 into a predetermined number of parts in a horizontal direction and a vertical direction as units, the image compression unit 6 in the following stage performs data compression processing on image data of the blocks B1, B2, B3, . . . in a sequence of raster scanning. Thus, the photoelectric conversion units of the image pickup element 3 are divided in such a manner as to correspond to the blocks B1, B2, B3, . . . , each division is assigned the period for outputting image pickup results in the sequence of raster scanning by XY address control by a driving circuit, and image pickup results of the photoelectric conversion units belonging to each division are output in this period. In addition, the photoelectric conversion units belonging to each division are assigned a period for performing the photoelectric conversion process with each division as a unit in the sequence of raster scanning. Thus, the image pickup element 3 outputs the image pickup results of these photoelectric conversion units by the image pickup signal S1. Incidentally, within each division, the image pickup element 3 outputs image pickup results by a one-system output in the sequence of raster scanning, a sequential scanning output with a column line as a unit, a simultaneous and parallel output by a plurality of systems with a line or a column line as a unit, or a simultaneous and parallel output of all pixels.

An analog-to-digital conversion circuit (AD) 7 subjects the image pickup signal S1 to an analog-to-digital conversion process, and then outputs image data D1. The image pickup device 1 subjects the image data D1 to a pixel interpolation process, a color space conversion process, an edge enhancement process, a noise removing process and the like by a signal processing circuit not shown in the figure, and then inputs the image data D1 to the image compression unit 6.

The image compression unit 6 data-compresses the image data D1 in units of the blocks B1, B2, B3, . . . , performs encoding processing, and then outputs encoded data D2 as a result of the processing.

A code amount calculating unit 8 measures a data amount of the encoded data output by the image compression unit 6 in the units of the blocks B1, B2, B3, . . . . The code amount calculating unit 8 thereby detects an amount of code generated by the data compression processing of the image compression unit 6 in each of the blocks B1, B2, . . . .

A compression ratio determining unit 9 controls the data compression ratio of data compression processing on a next block in the image compression unit 6 on the basis of the amount of generated code detected by the code amount calculating unit 8. The compression ratio determining unit 9 thereby performs a rate control process such that an amount of generated code per frame becomes a target code amount. Specifically, the compression ratio determining unit 9 calculates a value of difference TEX between a target code amount TS as a reference obtained by dividing an amount of code assigned to one frame by the number of blocks per frame and a generated code amount TE actually detected by the code amount calculating unit 8. The target code amount of the next block is corrected on the basis of the difference value TEX.

In correcting the target code amount of the block, various processing methods can be applied widely, such for example as in a case where the difference value TEX is added to or subtracted from the target code amount TS of the next block, thus directly correcting the target code amount TS of the next block, and a case where the difference value TEX is divided by the number of blocks in the frame the encoding processing of which blocks has not been completed yet, and the divided value is added to or subtracted from the target code amount TS of the next block, thus distributing the difference value TEX to the blocks the encoding processing of which has not been completed yet.

The compression ratio determining unit 9 variably controls the data compression ratio in the image compression unit 6 on the basis of the thus calculated target code amount.

An encoded stream storage unit 10 stores and outputs the encoded data D2 output from the image compression unit 6. An auxiliary rate control unit 11 performs rate control on the encoded data D2 output from the encoded stream storage unit 10. Incidentally, this rate control is performed by inserting dummy data or stopping transmission of the encoded data D2 of a predetermined block so that the code amount of each frame becomes a target code amount. The image pickup device 1 records the encoded data D2 output from the auxiliary rate control unit 11 onto a recording medium, and transmits the encoded data D2 to an external device. Thus, the encoded stream storage unit 10 and the auxiliary rate control unit 11 form data amount correcting means for storing one frame of the output data D2 of the image compression unit 6 as image compressing means and correcting data size. In the present embodiment, rate control is performed with a higher accuracy by the data amount correcting means.

Figure 7:
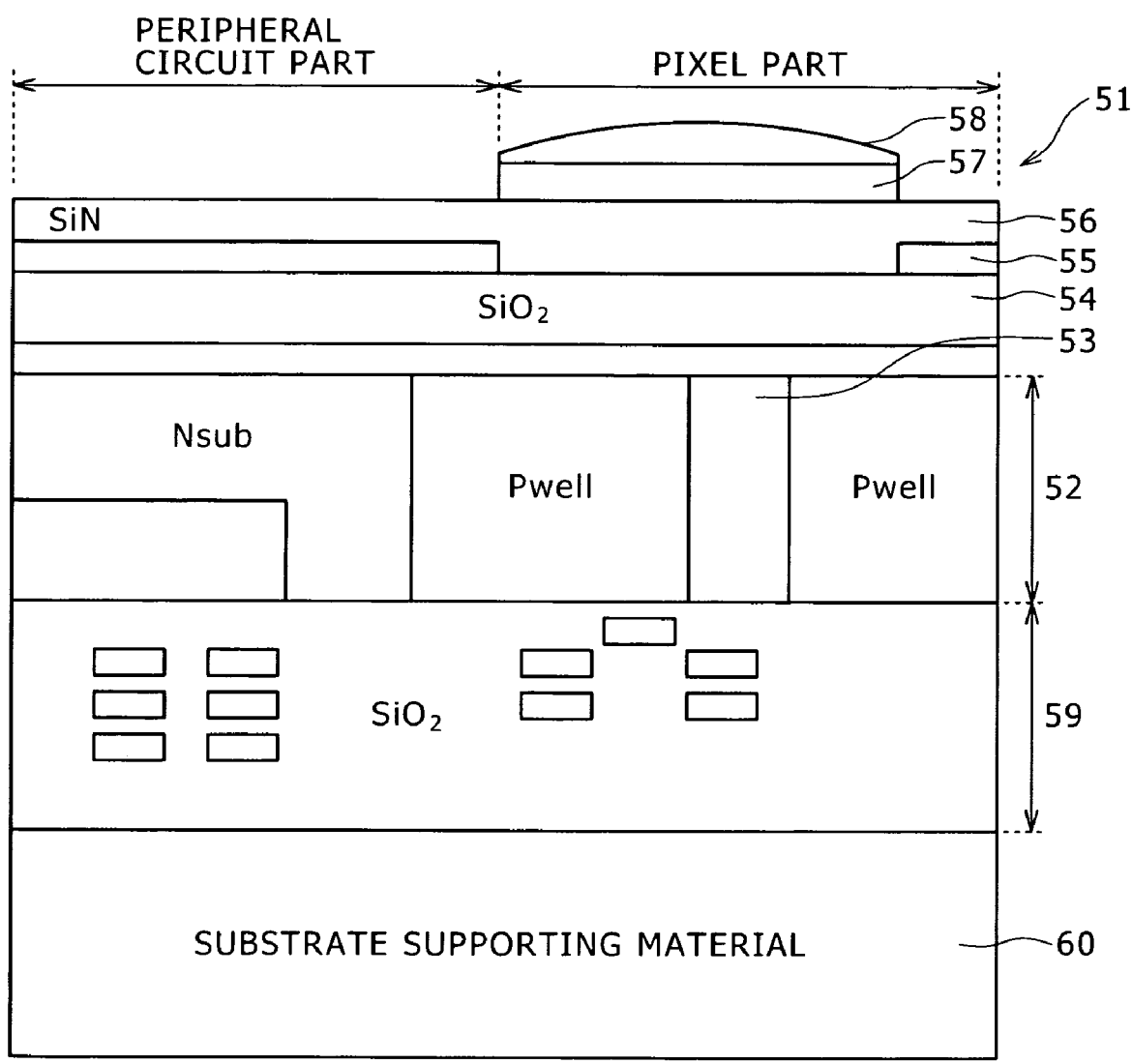
FIG. 7 is a sectional view of an integrated circuit applied to the image pickup device of FIG. 5.

FIG. 7 is a sectional view of a part of an integrated circuit applied to the image pickup device 1. This integrated circuit 51 is formed by integrating the image pickup element 3 and a peripheral circuit with each other. In the present embodiment, a driving circuit, not shown, for driving the image pickup element 3, the analog-to-digital conversion circuit 7, the image compression unit 6, the code amount calculating unit 8, the compression ratio determining unit 9, the encoded stream storage unit 10, the auxiliary rate control unit 11 and the like are applied to the peripheral circuit involved in the integration. Thereby the general configuration of the image pickup device according to the present embodiment is simplified.

In the integrated circuit 51, an image pickup element part is formed by arranging pixel parts in the form of a matrix. The image pickup element part forms the image pickup element 3. A peripheral circuit part is formed on the periphery of the image pickup element part. Thus, FIG. 7 is a sectional view of a part of the image pickup element part and the peripheral circuit part.

The integrated circuit 51 has an element layer 52 formed by a silicon (Si) layer including a thickness of about 10 to 20 [μm]. In a pixel part, the element layer 52 has a photodiode 53 formed therein for the process of photoelectric conversion in a pixel unit. In the peripheral circuit part, each circuit element such as a MOSFET or the like forming the peripheral circuit is formed on an under layer side of the element layer 52.

The integrated circuit 51 has a silicon oxide ($SiO_2$) film 54, a light shielding film 55, a silicon nitride (SiN) film 56, a color filter 57, and a microlens 58 sequentially laminated on an upper layer of the element layer 52. A wiring layer 59 for wiring the photodiode 53 and the circuit elements of the peripheral circuit is formed on the under layer side of the element-layer 52. A substrate supporting material 60 for retaining the whole is provided on an under layer side of the wiring layer 59. Thus, the integrated circuit 51 with the wiring layer 59 provided on the opposite side from the light receiving surface solves various problems when the wiring layer is provided on the side of the light receiving surface once and for all, and greatly improves a degree of freedom of wiring. Incidentally, the problems when the wiring layer is provided on the side of the light receiving surface include a decrease in amount of light incident on each pixel which decrease is caused by wiring forming the wiring layer, a crosstalk into an adjacent pixel, and the like.

Incidentally, since the integrated circuit 51 has the wiring layer 59 formed on the opposite side from the light receiving surface, a thin semiconductor substrate is processed from the side of the wiring layer 59 to form the photodiode 53 and the circuit elements of the peripheral circuit. Then the wiring layer 59 and the substrate supporting material 60 are sequentially formed on the semiconductor substrate. Thereafter the semiconductor substrate is turned over, the element layer 52 is completed by CMP polishing, and the light shielding film 55, the silicon nitride (SiN) film 56, the color filter 57, and the microlens 58 are sequentially formed, whereby the integrated circuit 51 is produced.

Thus, the image pickup device 1 has the wiring layer 59 formed on the opposite side from the light receiving surface on a precondition that the image pickup element 3 and the peripheral circuit be integrated into an integrated circuit. Therefore, a degree of freedom of wiring is greatly improved, a high degree of freedom of reading image pickup results, which is a feature of a CMOS solid-state image pickup element, is not impaired, and the general configuration is simplified.

Figure 8:
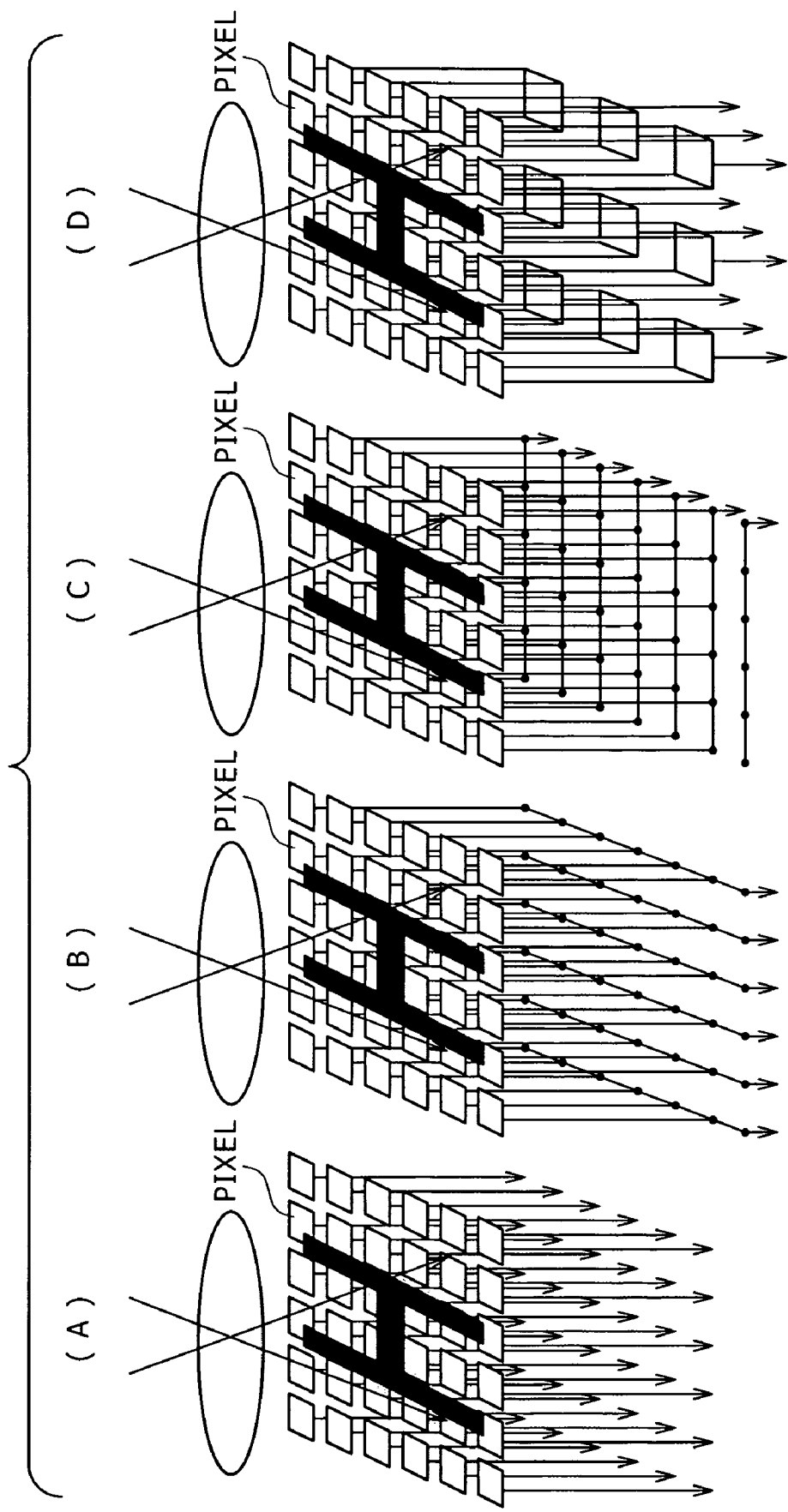
FIG. 8(A), FIG. 8(B), FIG. 8(C), and FIG. 8(D) are schematic diagrams of assistance in explaining output of image pickup results by the integrated circuit of FIG. 7.

Specifically, in the integrated circuit 51, as shown in FIG. 8(A), a connection between the image pickup element part and the peripheral circuit can be formed such that each pixel output is output to the peripheral circuit in a simultaneous and parallel manner for analog-to-digital conversion processing. Instead of this, as shown in FIG. 8(B), image pickup results can be output in a simultaneous and parallel manner with a column line as a unit and then processed by the peripheral circuit. In addition, as shown in FIG. 8(C), image pickup results can be output in a simultaneous and parallel manner with a line as a unit, and then processed by the peripheral circuit. Further, as shown in FIG. 8(D), image pickup results can be output in a simultaneous and parallel manner with a predetermined block as a unit, and then processed by the peripheral circuit. Thus the degree of freedom of output of the image pickup element can be greatly improved.

Incidentally, in the example of FIG. 8(A), since a signal line is provided for each pixel, image pickup results can be output by various X-Y address controls as for example in a case of simultaneously turning on MOSFETs provided for all pixels and outputting the image pickup results of all the pixels in a simultaneous and parallel manner, in a case of outputting image pickup results in a line unit by controlling horizontal address lines as described above with reference to FIG. 3, and in a case of outputting image pickup results of pixels contiguous in a vertical direction in a simultaneous and parallel manner by selection by vertical address lines instead of selection by the horizontal address lines, as will be described later with reference to FIG. 8(C). In the case of FIG. 8(C), one signal line is sequentially allocated to pixels contiguous in the horizontal direction by time division by controlling the vertical address lines instead of controlling the horizontal address lines as described above with reference to FIG. 3, so that image pickup results of pixels contiguous in the vertical direction can be output in a simultaneous and parallel manner. On the other hand, in the example of FIG. 8(D), a plurality of pixels of one block connected to one common signal line are sequentially selected by controlling vertical address lines and horizontal address lines, whereby image pickup results can be output in various sequences of raster scanning, zigzag scanning and the like in the block by the signal line. Incidentally, the horizontal address line and the vertical address lines are provided so as to be common to pixels contiguous in the horizontal direction and the vertical direction, so that the scanning sequence of these pixels is the same in a plurality of blocks.

Thus, in the image pickup device 1 according to the present embodiment, a period for outputting image pickup results is sequentially assigned to the divisions corresponding to the blocks B1, B2, B3, . . . , as described above with reference to FIG. 6 regarding the image pickup element 3, and image pickup results are output to the peripheral circuit according to a mode of output from photoelectric conversion units in each block by a corresponding connection among the connections of FIGS. 8(A) to 8(D).

(2) Operation of First Embodiment

In the image pickup device 1 (FIG. 5) formed as described above, the lens 2 forms an image of a subject on an image pickup surface (light receiving surface) of the image pickup element 3, the image pickup element 3 outputs a result of picking up the image, and the analog-to-digital conversion circuit 7 converts the result of picking up the image to image data D1. The image data D1 is subjected to processing such as edge enhancement and the like, and then data-compressed by the image compression unit 6 to be converted into encoded data D2. The encoded data D2 is recorded onto a recording medium and transmitted to an external device via the encoded stream storage unit 10 and the auxiliary rate control unit 11. Thus, the image pickup device 1 data-compresses, records, and transmits the image pickup result.

In the above series of processes, when the image data D1 of one block is data-compressed with the blocks B1, B2, B3, . . . formed by dividing the image pickup result into a predetermined number of parts in each of the horizontal direction and the vertical direction (FIG. 6) as a unit, on the basis of an amount of code thereby generated, a data compression ratio for data compression of a next block is variably controlled, and by repeating this process, the image data D1 is data-compressed with one frame as a unit. Thereby the image pickup device 1 can reliably perform rate control, and record and output the image pickup result at a desired transmission rate.

Further, in the present embodiment, the encoded data D2 is temporarily recorded and retained in the encoded stream storage unit 10, and the encoded data D2 is output while the encoded stream storage unit 10 inserts dummy data or stops transmission of the encoded data D2 of a predetermined block. Thereby the image pickup device 1 can perform rate control more reliably, and record onto the recording medium and output the image pickup result at a desired transmission rate.

Thus, image pickup results thus being processed sequentially in block units, the photoelectric conversion units corresponding to the respective pixels provided in the image pickup element 3 are divided in such a manner as to correspond to the blocks B1, B2, B3, . . . as processing units in the image compression unit 6, each of these divisions is assigned the period for outputting image pickup results sequentially so as to correspond to the processing in the image compression unit 6, and image pickup results of the corresponding division are output by an image pickup signal S1 in this period. In a period other than this period, the photoelectric conversion units of each division are used for the photoelectric conversion process.

Thus, with the configuration that only sequentially inputs the image pickup results output from the image pickup element 3 to the image compression unit 6 via the analog-to-digital conversion circuit 7, the image pickup device 1 can perform a process of sequential image compression in block units, and perform rate control, whereby the general configuration can be simplified.

Thus, the image pickup element 3 formed by a CMOS solid-state image pickup element has a high degree of freedom in reading image pickup results by outputting the image pickup results by XY address control. It is thereby possible to output the image pickup results of image pickup means in various modes, such for example as not only line-sequential output of the image pickup results with a line as a unit but also output of the image pickup results with a column line as a unit, and output of the image pickup results with a predetermined block as a unit. Thereby, in the present embodiment, a period for outputting image pickup results is sequentially assigned to divisions corresponding to the blocks as processing units in the image compression unit 6, and in this period, the image pickup results of a corresponding division are output. Thereby, a high degree of freedom of reading image pickup results, which is a feature of a CMOS solid-state image pickup element, is utilized effectively, and the general configuration is further simplified.

In the image pickup device 1, the image pickup element 3 thus outputting the image pickup results is formed integrally with the analog-to-digital conversion circuit 7, the image compression unit 6 and the like as the peripheral circuit for processing the image pickup results of the image pickup element 3 by the integrated circuit. Thereby the general configuration is reduced in size, and the configuration is simplified.

However, when the image pickup element and the peripheral circuit are simply integrated with each other by a CMOS process, a wiring pattern for the image pickup element and the peripheral circuit causes various inconveniences, and it is thereby impossible to make full use of the high degree of freedom of reading image pickup results. Therefore, in the present embodiment, a wiring layer is formed on a surface on the opposite side from the light receiving surface of the image pickup means, and the photoelectric conversion units forming the image pickup means and the peripheral circuit are connected to each other and retained integrally with each other by the wiring layer. It is thereby possible to form the integrated circuit such that full use of the high degree of freedom of reading image pickup results can be made, surely make effective use of the high degree of freedom of reading image pickup results, and simplify the general configuration.

(3) Effect of First Embodiment

According to the above configuration, the image pickup means and image compressing means are connected to each other by the wiring layer formed on the surface on the opposite side from the light receiving surface of the image pickup means, and are thereby integrated with each other. On the basis of an amount of code generated in each block by data compression in a predetermined block unit, the data compression ratio of a next block is controlled. In addition, a period for outputting image pickup results is sequentially set to a division of photoelectric conversion units corresponding to this block, and the image pickup results are output from the image pickup element. It is thereby possible to make effective use of the high degree of freedom of reading image pickup results, which is a feature of a CMOS solid-state image pickup element, simplify the general configuration, and reliably perform rate control.

(4) Second Embodiment

In an image pickup device according to this embodiment, a wavelet transform process is applied as the data compression process of the image compression unit 6 described above with reference to FIG. 5. The image pickup device according to the present embodiment is formed in the same manner as the above-described image pickup device 1 according to the first embodiment except that a configuration related to the wavelet transform process of an image compression unit 6 of the image pickup device according to the present embodiment is different. Thus, in the present embodiment, description will be made using the configuration shown in FIG. 5.

In the image compression unit 6, a wavelet transform unit subjects image data D1 to the wavelet transform process in a block unit, and a quantizing unit and an entropy coding unit sequentially subject the result to a quantizing process and an entropy coding process, thereby outputting encoded data D2. The wavelet transform unit performs the wavelet transform process in a block unit by a line-based wavelet transform process.

Figure 9:
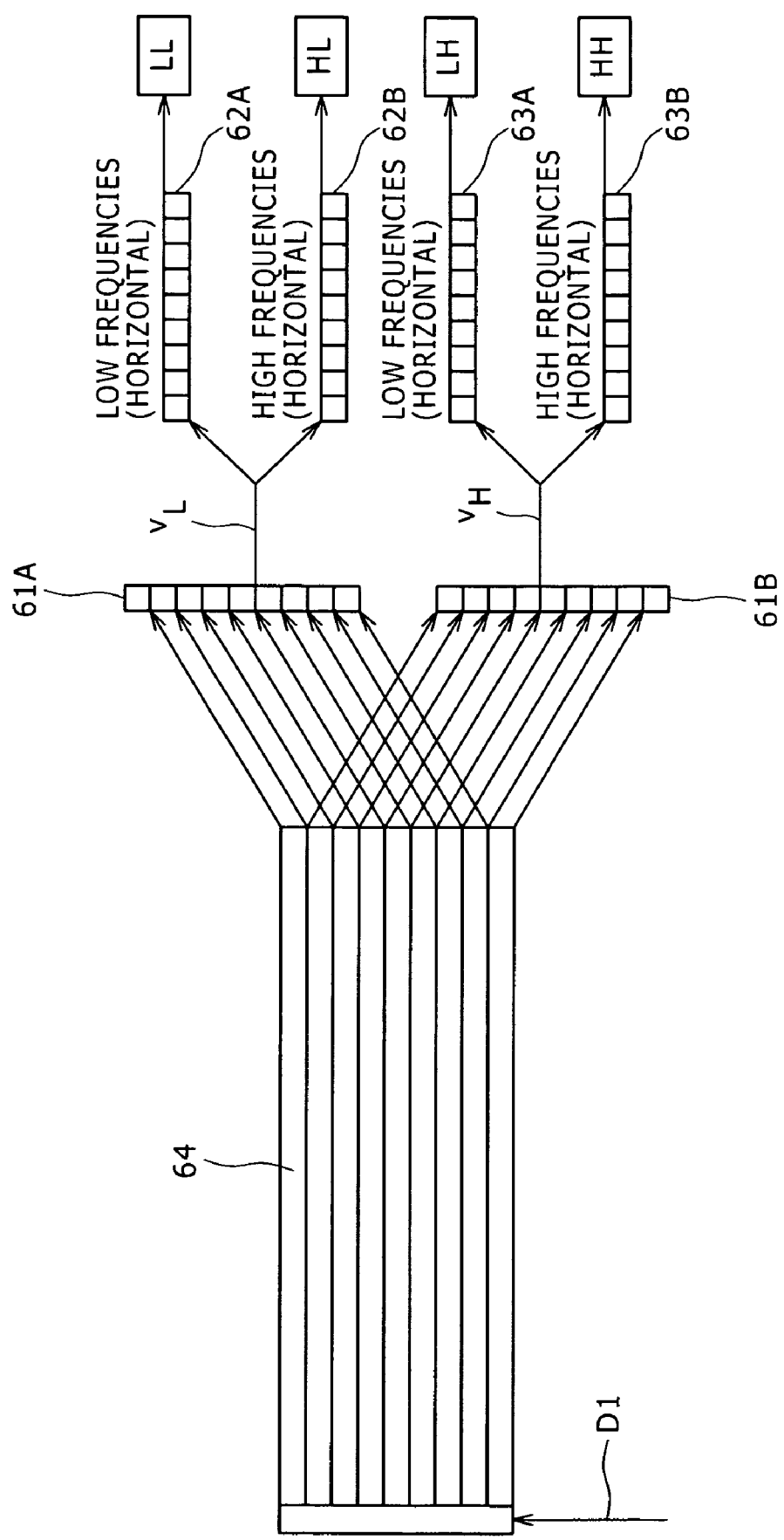
FIG. 9 is a schematic diagram of assistance in explaining a wavelet transform unit in an image pickup device according to a second embodiment of the present invention.

As shown in FIG. 9 representing a band dividing process in one stage, the wavelet transform unit band-limits the image data D1 to two band components 'L and 'H by a low-pass filter 61A and a high-pass filer 61B including a predetermined number of taps in a vertical direction. The wavelet transform unit band-limits the band components 'L and 'H by a low-pass filter 62A and a high-pass filer 62B and a low-pass filter 63A and a high-pass filer 63B including a predetermined number of taps in a horizontal direction. The wavelet transform unit thereby generates subbands LL to HH. Thus, the wavelet transform unit temporarily retains and outputs input image data D1 to be used for the band dividing process by means of a line buffer 64 by an amount corresponding to the number of taps of the low-pass filter 61A and the high-pass filer 61B in the input stage of each band dividing process.

Figure 10:
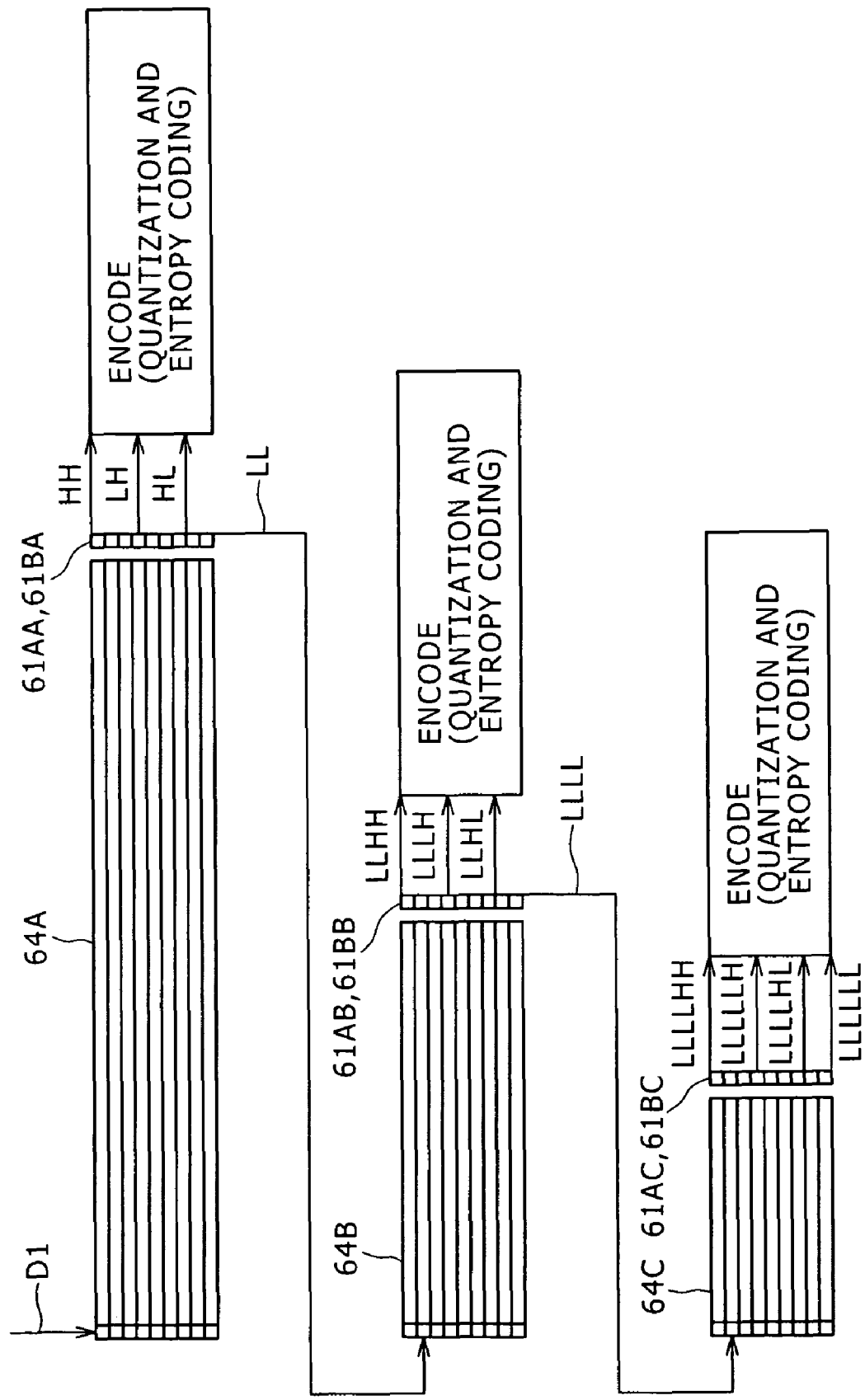
FIG. 10 is a schematic diagram of assistance in explaining band division in the wavelet transform unit in the image pickup device of FIG. 9.

As shown in FIG. 10, the wavelet transform unit performs such a band dividing process in three stages. Wavelet transform coefficients HH to LLLLLL resulting from the band dividing processes are processed by a processing circuit in a subsequent stage. The input stages of these band dividing processes are respectively provided with corresponding line buffers 64A to 64C. The image data output from the analog-to-digital conversion circuit 7 is directly input to the line buffer 64A in the first stage.

Figure 11:
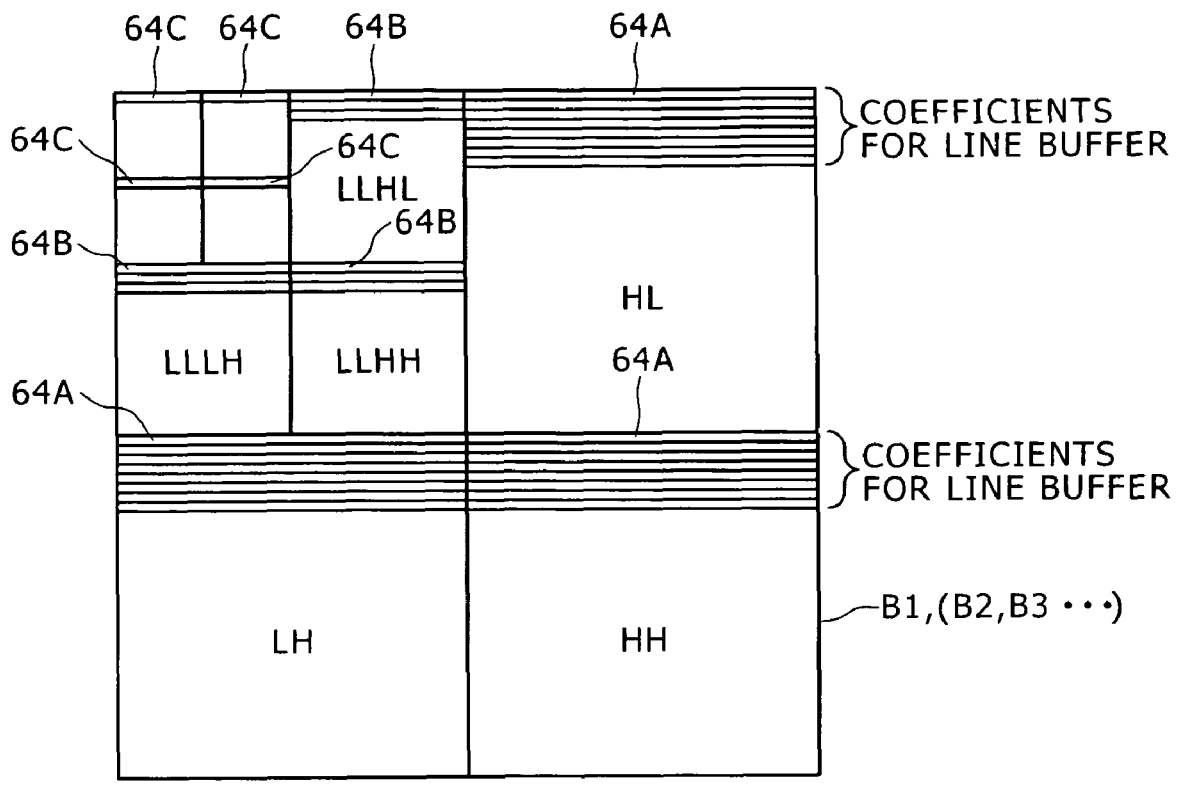
FIG. 11 is a schematic diagram of assistance in explaining coefficients for line buffers resulting from processing in the wavelet transform unit in the image pickup device of FIG. 9.

These processes accumulate wavelet transform coefficient data in the line buffers 64A to 64C as shown in FIG. 11. When the data is accumulated in the line buffers 64A to 64C after processing of one frame of image data D1 is started, the line buffers 64A to 64C each output corresponding coefficient data.

The wavelet transform unit of the image compression unit 6 is provided with the line buffer 64A including a number of samplings in the horizontal direction of blocks B1, B2, B3, . . . , and the line buffers 64B and 64C with ½ and ¼ of the number of samplings of the line buffer 64A. Tap outputs output from the respective line buffers 64A to 64C in a simultaneous and parallel manner are band-limited and down-sampled by low-pass filters and high-pass filers 61AA and 61BA, 61AB and 61BB, and 61AC and 61BC, respectively, in the vertical direction, and are then band-limited and down-sampled by low-pass filters and high-pass filers in the horizontal direction, whereby the wavelet transform coefficient data of the subbands HH to LLLLLL is generated.

Thus, the wavelet transform unit in the present embodiment applies the line-based wavelet transform process to process image data in block units, whereby the capacity of the line buffer as a memory circuit provided on the input side of each dividing process is reduced and the general configuration is simplified.

In correspondence with the configuration of the wavelet transform unit, the image compression unit 6 forms each block by a number of lines equal to or larger than the number of taps of the vertical filter of the wavelet transform unit and a number of samplings in the horizontal direction equal to or larger than the number of taps of the horizontal filter.

In correspondence with the processing of the wavelet transform unit, an image pickup element 3 outputs image pickup results of respective photoelectric conversion units within each division in a sequence of line scanning corresponding to the processing sequence of the wavelet transform unit under XY address control by a driving circuit. Thus, in the present embodiment, the image data D1 can be directly input to the wavelet transform unit to be processed, and the general configuration can be correspondingly simplified.

On the other hand, a compression ratio determining unit 9 variably controls the data compression ratio of an image compression unit 6 by changing and controlling a quantization scale in the quantizing unit. The compression ratio determining unit 9 is thus configured so as to be able to change the data compression ratio simply and surely.

According to the configuration of the second embodiment, image pickup means and image compressing means are connected to each other by a wiring layer formed on a surface on the opposite side from the light receiving surface of the image pickup means, and are thereby integrated with each other. On the basis of an amount of code generated in each block by data compression in a predetermined block unit, the data compression ratio of a next block is controlled. In addition, a period for outputting image pickup results is sequentially set to a division of photoelectric conversion units corresponding to this block, and the image pickup results are output from the image pickup element. The data compression process for this block is performed by a wavelet transform process. It is thereby possible to make effective use of a high degree of freedom of reading image pickup results, which is a feature of a CMOS solid-state image pickup element, simplify the general configuration, and reliably perform rate control.

In addition, coefficient data resulting from the wavelet transform process is quantized, and the data compression ratio is controlled through control of the quantization scale for the quantization, whereby rate control can be performed simply and surely.

(5) Third Embodiment

This embodiment performs data compression by a tile-based wavelet transform process in place of the line-based wavelet transform process of the above-described image pickup device according to the second embodiment. The image pickup device according to the present embodiment is formed in the same manner as the above-described image pickup device according to the second embodiment except that a configuration related to the wavelet transform process of the image pickup device according to the present embodiment is different. Thus, as in the second embodiment, description below will be made of the embodiment using the configuration shown in FIG. 5. In the description, repeated description of the same configuration as in the image pickup device 1 according to the first embodiment will be omitted.

Figure 12:
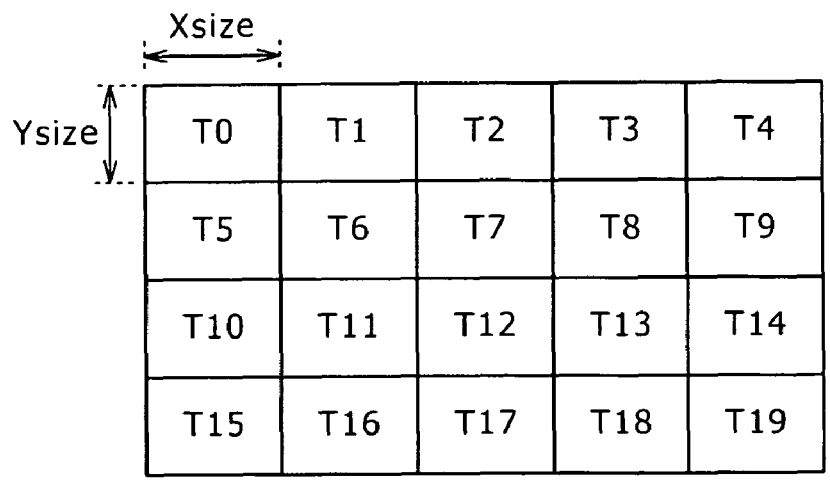
FIG. 12 is a schematic diagram of assistance in explaining an image compression unit in an image pickup device according to a third embodiment of the present invention.

In an image compression unit 6 of this image pickup device, a wavelet transform unit subjects image data D1 to the wavelet transform process in block units, and a quantizing circuit and an entropy coding unit sequentially subject coefficient data obtained as a result of the wavelet transform process to quantization and entropy coding, and then output encoded data D2. As shown in FIG. 12, the wavelet transform unit of the image compression unit 6 sets tiles T0, T1, T2, . . . , which are blocks formed by dividing an image based on an image pickup result into a predetermined number of divisions in each of a horizontal direction and a vertical direction, as processing units. The wavelet transform unit is sequentially supplied with the image data D1 in the units of the tiles T0, T1, T2, . . . in a sequence of raster scanning, and performs wavelet transform processes. The wavelet transform unit performs these wavelet transform processes by a two-dimensional filter circuit.

In correspondence with the processing of the wavelet transform unit, an image pickup element 3 outputs image pickup results in each tile unit under XY address control by a driving circuit. Within each tile, the image pickup element 3 outputs image pickup results in a sequence corresponding to the processing of the two-dimensional filter circuit involved in the processes of the wavelet transform unit.

According to the configuration of the third embodiment, image pickup means and image compressing means are connected to each other by a wiring layer formed on a surface on the opposite side from the light receiving surface of the image pickup means, and are thereby integrated with each other. On the basis of an amount of code generated in each block by data compression in a predetermined block unit, the data compression ratio of a next block is controlled. In addition, a period for outputting image pickup results is sequentially set to a division of photoelectric conversion units corresponding to this block, and the image pickup results are output from the image pickup element. The process for this block is performed by a tile-based wavelet transform process. It is thereby possible to make effective use of a high degree of freedom of reading image pickup results, which is a feature of a CMOS solid-state image pickup element, simplify the general configuration, and reliably perform rate control.

(5) Fourth Embodiment

In this embodiment, the above-described image pickup device according to the second embodiment applies a discrete cosine transform process in place of the wavelet transform process to data-compress image data. The image pickup device according to the present embodiment is formed in the same manner as the above-described image pickup device according to the second embodiment except that a configuration related to the data compression process is different. Thus, as in the second embodiment, description below will be made of the embodiment using the configuration shown in FIG. 5. In the description, repeated description of the same configuration as in the image pickup device 1 according to the first embodiment will be omitted.

Figure 13:
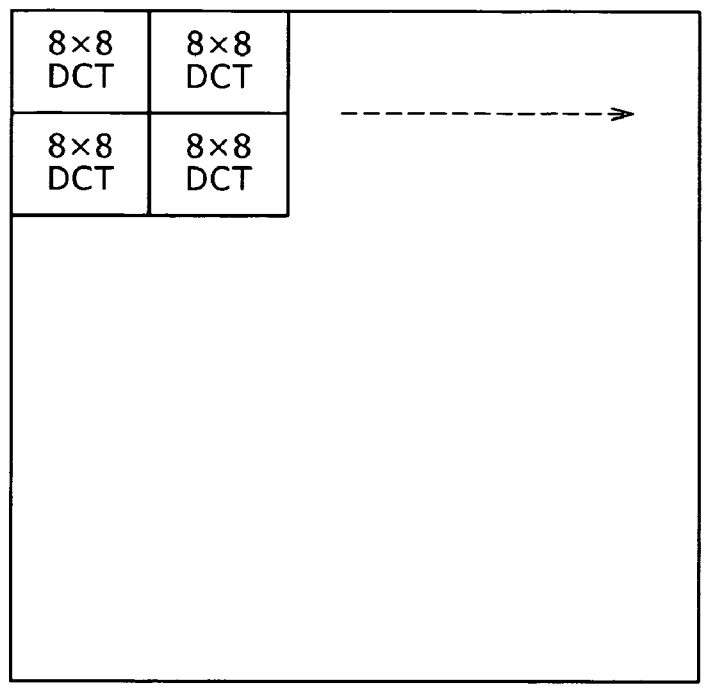
FIG. 13 is a schematic diagram of assistance in explaining an image compression unit in an image pickup device according to a fourth embodiment of the present invention.

In this image pickup device, an image compression unit 6 is supplied with image data D1 in macroblock units as discrete cosine transform processing units, performs discrete cosine transform processing by a discrete cosine transform processing unit, subjects coefficient data obtained as a result of the discrete cosine transform processing to a quantizing process and a variable-length coding process, and then outputs the result. In the present embodiment, as shown in FIG. 13, the macroblock is set as a block of 8×8 pixels. Incidentally, as appropriate, the image compression unit 6 is supplied with image data D1 used in the discrete cosine transform process in a form of difference data processed by motion prediction.

In correspondence with the discrete cosine transform process, an image pickup element 3 outputs image pickup results in macroblock units in a sequence of raster scanning under XY address control by a driving circuit. In each macroblock, image pickup results of 8×8 pixels forming the macroblock are output in a simultaneous and parallel manner.

According to the configuration of the fourth embodiment, image pickup means and image compressing means are connected to each other by a wiring layer formed on a surface on the opposite side from the light receiving surface of the image pickup means, and are thereby integrated with each other. On the basis of an amount of code generated in each block by data compression in a predetermined block unit, the data compression ratio of a next block is controlled. In addition, a period for outputting image pickup results is sequentially set to a division of photoelectric conversion units corresponding to this block, and the image pickup results are output from the image pickup element. The process for this block is performed by a discrete cosine transform process. It is thereby possible to make effective use of a high degree of freedom of reading image pickup results, which is a feature of a CMOS solid-state image pickup element, simplify the general configuration, and reliably perform rate control.

(7) Fifth Embodiment

Figure 14:
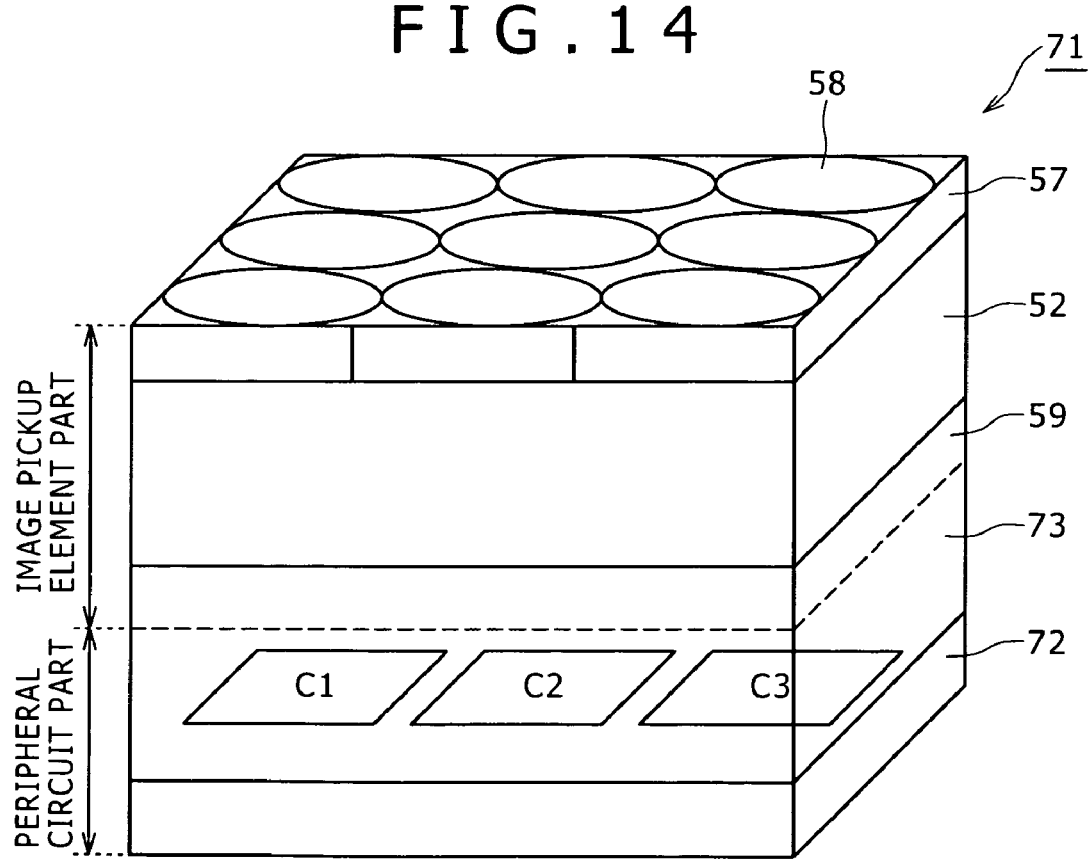
FIG. 14 is a perspective view of a part of an integrated circuit applied to an image pickup device according to a fifth embodiment of the present invention.

FIG. 14 is a perspective view of a part of an integrated circuit applied to an image pickup device according to a fifth embodiment of the present invention. In the present embodiment, this integrated circuit forms the image pickup devices according to the foregoing first to fourth embodiments. Incidentally, in the integrated circuit 71, the same constitutions as in the integrated circuit 51 described above in the first embodiment are identified by corresponding reference symbols, and repeated description will be omitted.

The integrated circuit 71 is formed by integrating an image pickup element 3 and a peripheral circuit with each other. This peripheral circuit is formed in the same manner as the image compression unit and the like of each of the foregoing embodiments. Thereby the general configuration of the image pickup device according to the present embodiment is simplified.

This integrated circuit 71 is formed by laminating an image pickup element part to a peripheral circuit part. The peripheral circuit part is made by forming semiconductor devices constituting the peripheral circuit on a semiconductor substrate 72 by a predetermined semiconductor process and then forming a wiring layer 73 over the semiconductor devices to connect the semiconductor devices. The peripheral circuit part has electrodes and the like for connection to the image pickup element part, the electrodes and the like being formed on a surface of the wiring layer 73.

As in the foregoing first embodiment, the image pickup element part is formed by arranging pixel parts in the form of a matrix. An element layer 52 is formed by a silicon (Si) layer including a thickness of about 10 to 20 [μm]. A photodiode for a process of photoelectric conversion in a pixel unit is formed in the element layer 52 of the image pickup element part.

The image pickup element part has an image pickup surface formed by sequentially laminating a silicon oxide film, a light shielding film, a silicon nitride film, a color filter 57, and a microlens 58 on an upper layer of the element layer 52. On the other hand, the image pickup element part has a wiring layer 59 under the element layer 52. The peripheral circuit part is disposed on an under layer side of the wiring layer 59. The wiring layer 73 of the peripheral circuit part and the wiring layer 59 are connected to each other, whereby the image pickup element and the peripheral circuit are integrated into an integrated circuit.

Thus, the integrated circuit 71 with the wiring layer 59 provided on the opposite side from the light receiving surface solves various problems when the wiring layer 59 is provided on the side of the light receiving surface once and for all, and greatly improves a degree of freedom of wiring. In addition, since the image pickup element part is integrated with the peripheral circuit part, in which the peripheral circuit is formed, via the wiring layer 59 thus formed on the opposite side from the light receiving surface, the image pickup element part and the peripheral circuit part can be produced by different wafer processes and then integrated with each other. Accordingly, the image pickup element part and the peripheral circuit part are produced by wafer processes suitable for the image pickup element part and the peripheral circuit part, respectively, so that various performances as a whole can be improved.

Specifically, the peripheral circuit part in which the peripheral circuit is formed is formed at a high density with each semiconductor device and a wiring pattern width made smaller, so that chip size can be decreased and power consumption can be reduced. However, in the image pickup element part, a reduction in pixel size correspondingly decreases sensitivity, and a chip area is increased according to the number of pixels. Thus, when the image pickup element part and the peripheral circuit part are produced by different wafer processes and then integrated with each other as in the present embodiment, the image pickup element part and the peripheral circuit part can be produced by wafer processes suitable for the image pickup element part and the peripheral circuit part, respectively, so that various performances as a whole can be improved accordingly.

Incidentally, since the image pickup element part is integrated with the peripheral circuit part, in which the peripheral circuit is formed, via the wiring layer 59 thus formed on the opposite side from the light receiving surface, for the integrated circuit 71, as in the foregoing first embodiment, a thin semiconductor substrate is processed from the side of the wiring layer 59 to form the photodiode. Then the wiring layer 59 is formed on the semiconductor substrate, and the peripheral circuit part produced by a different process is laminated. Thereafter, the semiconductor substrate is turned over, the element layer 52 is completed by CMP polishing, and then the light shielding film, the color filter 57, the microlens 58 and the like are sequentially formed, whereby the integrated circuit 71 is produced.

In the integrated circuit 71 formed by laminating semiconductor substrates resulting from such different wafer processes, the outputting of image pickup results in the various modes described above with reference to FIGS. 8(A) to 8(D)

can be performed more easily, and thus a degree of freedom of output of the image pickup element can be greatly improved.

Further, in the present embodiment, the integrated circuit 71 with such connections outputs image pickup results to the peripheral circuit in a simultaneous and parallel manner by a plurality of systems. In the peripheral circuit, an image compression unit 6 for data compression processing is formed by three system processing circuits C1 to C3. The three system processing circuits C1 to C3 process the image data output by the plurality of systems in a simultaneous and parallel manner.

In the present embodiment, by forming the peripheral circuit under the wiring layer of the image pickup element part, the image pickup element and the peripheral circuit are integrated into an integrated circuit with a higher degree of freedom. Thereby image pickup results are output with a higher degree of freedom. It is thus possible to make effective use of a high degree of freedom of reading image pickup results, which is a feature of a CMOS solid-state image pickup element, simplify the general configuration, and reliably perform rate control.

Further, the peripheral circuit is produced by a wafer production process different from that of image pickup means. Thus, the image pickup element part and the peripheral circuit part are produced by wafer processes suitable for the image pickup element part and the peripheral circuit part, respectively, so that various performances can be improved.

(8) Sixth Embodiment

Figure 15:
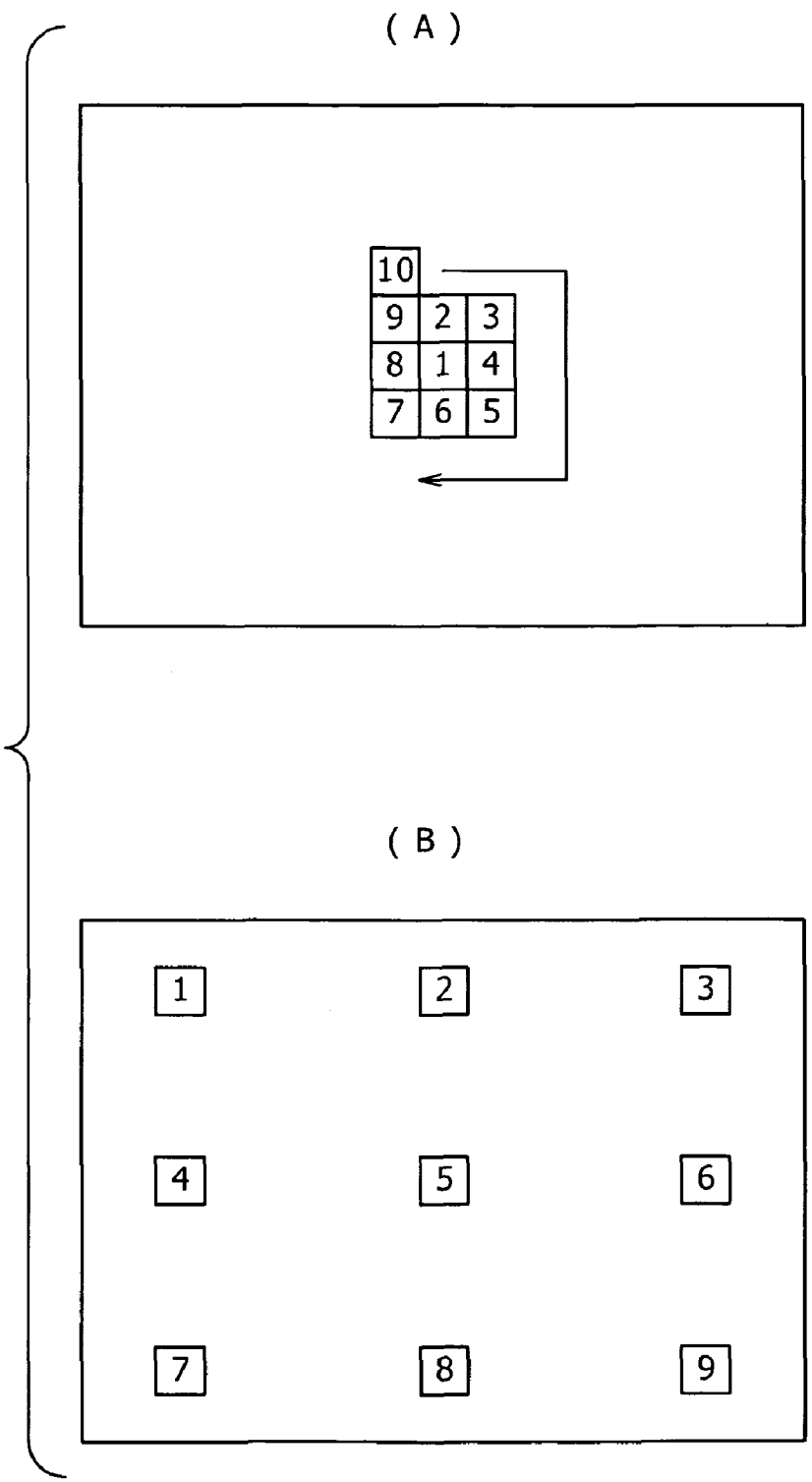
FIGS. 15(A) and 15(B) are plan views of assistance in explaining output of image pickup results in an image pickup device according to a sixth embodiment of the present invention.

FIGS. 15(A) and 15(B) are plan views representing a sequence of processing of blocks used in a data compression process in an image pickup device according to a sixth embodiment of the present invention, as contrasted with FIG. 6. The image pickup device according to the present embodiment is formed in the same manner as the foregoing first to fifth embodiments except that a configuration related to the processing of blocks is different. Thus, in the following, description will be made using the configuration shown in FIG. 5. Incidentally, in FIG. 15, numbers in respective blocks represent a sequence of processing of the respective blocks.

In the present embodiment, a system controller not shown in the figure receives a setting of a photographing mode, and changes the sequence of processing of blocks in an image compression unit 6 according to the photographing mode. Thus, the system controller changes the operation of a driving circuit for driving an image pickup element 3 in response to an operation of selecting a photographing mode by a user. The image pickup element 3 changes a sequence of output of image pickup results in block units according to the changed operation of the driving circuit.

Specifically, the system controller changes the order of blocks output from the image pickup element 3 such that data is compressed sequentially starting at a most important position in a photographing mode selected by the user.

Specifically, when the photographing mode selected by the user is a person photographing mode, for example, image pickup results associated with a person are important. In this case, the person is often located at the center of an effective image pickup area, and the background and the foreground of the person are not so important as the person. Therefore, as shown in FIG. 15(A), the output of image pickup results is started at a block at the center of the effective image pickup area, and blocks from which to output image pickup results are sequentially changed from the block at the center to outer blocks. In the present embodiment, blocks from which to output image pickup results are sequentially changed from the block at the center to outer blocks in such a manner as to form a spiral path.

On the other hand, when the photographing mode selected by the user is a landscape mode, for example, substantially the entire effective image pickup area is important. Therefore, as shown in FIG. 15(B), blocks that have priority in data compression are set discretely, and the operation of the image pickup element 3 is controlled such that these blocks are subjected to data compression first, and then other blocks are subjected to data compression in predetermined order. Incidentally, in the present embodiment, the discrete blocks are set at a plurality of positions at the center of the effective image pickup area and on the periphery thereof.

Further, in order to allocate an amount of code to a position such that the more important the position, the larger the amount of code, the system controller controls the operation of a compression ratio determining unit 9 such that a data compression ratio for data compression of each block is set on the basis of generated code amounts of the blocks preferentially subjected to data compression and detected. Specifically, the system controller controls the operation of the compression ratio determining unit 9 such that amounts of code allocated to preferentially processed blocks and other blocks are changed according to the photographing mode.

Thus, the present embodiment changes the sequence of processing of blocks and allocation of code amounts such that blocks of an area considered to be important by the user are given priority, and performs a rate control process by a same configuration as in the first to fifth embodiments. With a correspondingly high image quality, it is possible to make effective use of a high degree of freedom of reading image pickup results, which is a feature of a CMOS solid-state image pickup element or the like, simplify the general configuration, and reliably perform rate control.

Incidentally, when blocks to be preferentially subjected to data compression are set discretely as shown in FIG. 15(B), it is possible to roughly detect a distribution of generated code amounts of the entire screen and generated code amounts resulting from data compression of the entire screen on the basis of generated code amounts resulting from preferential data compression processing on these blocks. Thus, on the basis of the generated code amounts resulting from the preferential data compression processing, the distribution of the generated code amounts and the generated code amounts of the entire screen may be estimated, and on the basis of a result of the estimation, the data compression ratio of each block and further the data compression ratio of the entire screen may be set. This also makes it possible to make effective use of a high degree of freedom of reading image pickup results, which is a feature of a CMOS solid-state image pickup element or the like, allocate amounts of code more properly and reliably, and perform rate control.

(9) Seventh Embodiment

Figure 16:
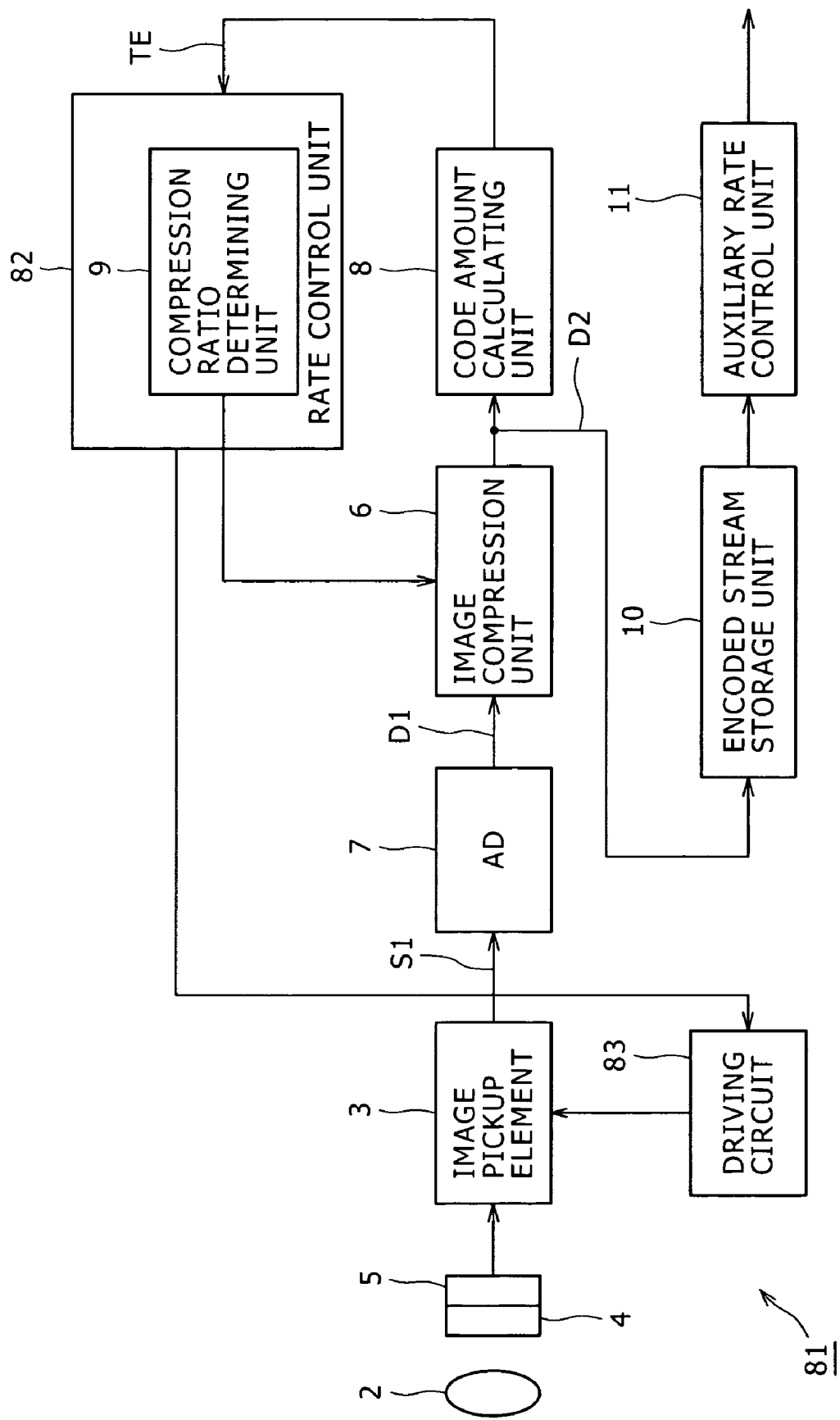
FIG. 16 is a block diagram showing an image pickup device according to a seventh embodiment of the present invention.

FIG. 16 is a block diagram showing an image pickup device according to a seventh embodiment of the present invention, as contrasted with FIG. 5. In the image pickup device 81, a rate control unit 82 controls operation of various parts on the basis of a generated code amount detected in a code amount calculating unit 8. Incidentally, the image pickup device 81 according to the present embodiment is formed in the same manner as the above-described image pickup devices according to the first to sixth embodiments except that the control of the various parts by the rate control unit 82 is different. Thus, in the following, only the configuration of the rate control unit 82 will be described, and repeated description will be omitted.

In the present embodiment, when processing for one frame is started and a generated code amount detected in the code amount calculating unit 8 is within a certain range, the rate control unit 82 performs a rate control process by controlling a data compression ratio by means of a compression ratio determining unit 9, as described in the foregoing first to sixth embodiments. On the other hand, when the generated code amount exceeds the certain range, in conjunction with the control of the data compression ratio by means of the compression ratio determining unit 9, the rate control unit 82 controls a driving circuit 83 for driving an image pickup element 3 to change the frame rate of an image pickup signal S1 output from the image pickup element 3. The rate control unit 82 thus performs a rate control process.

That is, when the generated code amount is larger than this range, the rate control unit 82 lowers the frame rate of the image pickup signal S1 according to the generated code amount. On the other hand, when the generated code amount is smaller than this range, the rate control unit 82 increases the frame rate of the image pickup signal S1 according to the generated code amount, and also controls the data compression ratio, whereby the data transfer rate of encoded data D2 is maintained at a certain value.

When the frame rate of the image pickup result is changed in addition as in the present embodiment, rate control can be performed more reliably. Incidentally, the frame rate of the image pickup element 3 may be changed according to a direct instruction from a user or a specification of a photographing mode or an operation mode by the user. Further, the certain range for the control of the frame rate may be varied.

(10) Other Embodiments

It is to be noted that while in the foregoing embodiments, description has been made of a case where the auxiliary rate control unit 11 also controls the rate of the encoded data D2, the present invention is not limited to this. The configuration of the auxiliary rate control unit 11 may be omitted when practically adequate rate control can be performed.

In addition, while in the foregoing embodiments, description has been made of a case where a CMOS solid-state image pickup element is applied to image pickup means, the present invention is not limited to this. Various image pickup elements based on XY address control are widely applicable.

INDUSTRIAL APPLICABILITY

The present invention is applicable to video cameras recording an image pickup result by moving picture, electronic still cameras, monitoring devices and the like.

Figure 3:
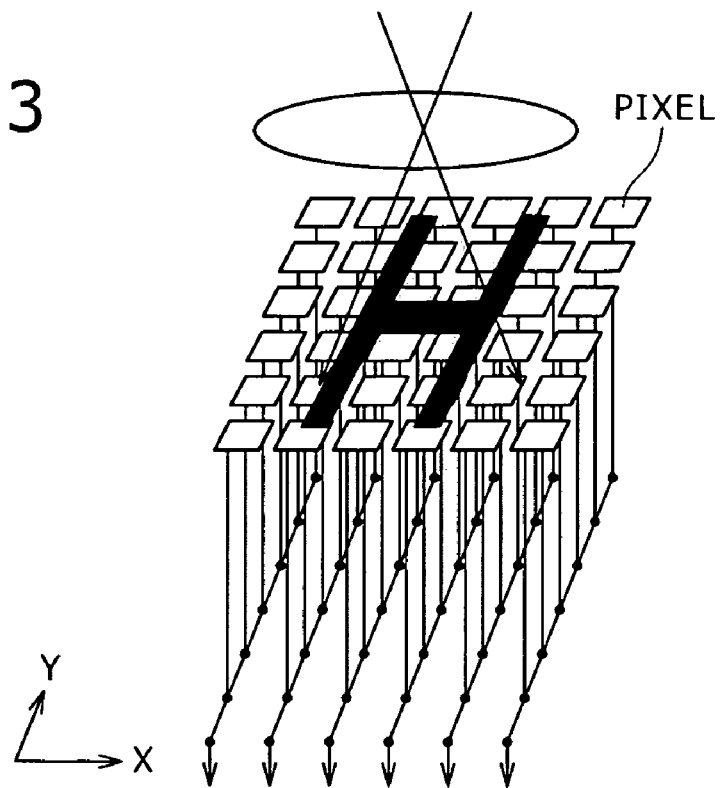
FIG. 3 is a schematic diagram showing output by a CMOS solid-state image pickup element.
Figure 4:
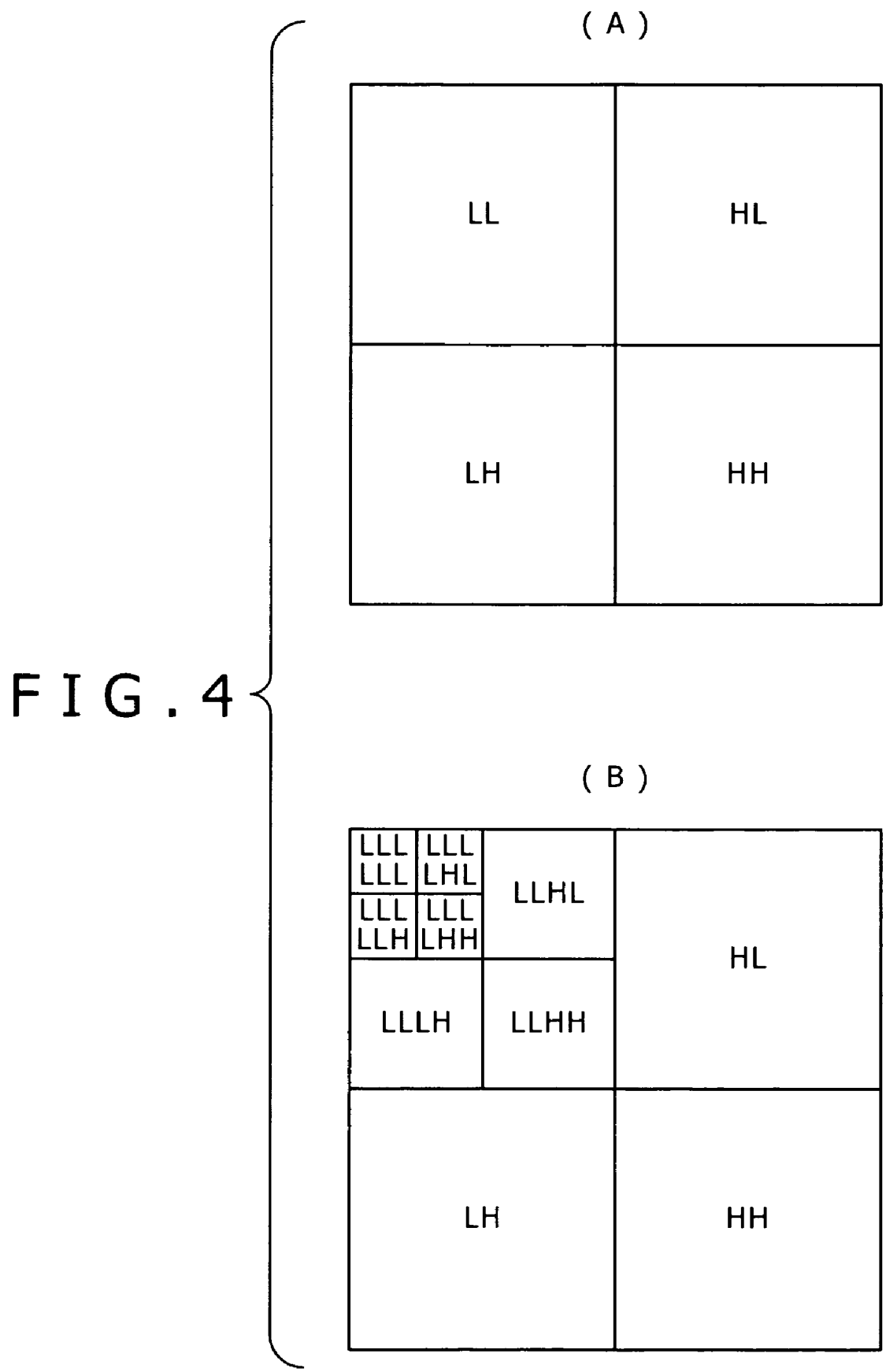
FIGS. 4(A) and 4(B) are schematic diagrams of assistance in explaining a wavelet transform process.

FIG. 1
From Left, above
BASIC STRUCTURE
SERIAL IMAGE OUTPUT DEVICE (PASSIVE SENSOR)
MULTI-ARRAY CCD (ACTIVE SENSOR)
MOST SIGNIFICANT FEATURE
SINGLE FUNCTION
MULTIFUNCTION AND HIGH FUNCTIONALITY
READING SYSTEM
SERIAL (THERE IS LIMITATIONS IN READING)
X-Y ADDRESS (HIGH DEGREE OF FREEDOM IN READING)
CHARACTERISTICS BETWEEN PIXELS
HIGH UNIFORMITY BETWEEN PIXELS
THERE IS CHARACTERISTIC DIFFERENCE BETWEEN PIXELS
HIGH SPEED
DIFFICULT TO ATTAIN CONTINUOUS HIGH SPEED
EASY TO ATTAIN CONTINUOUS HIGH SPEED
ACCUMULATION TIME AND END TIME
SIMULTANEOUS IN ALL PIXELS
DIFFERENT TIMES IN COLUMN OR PIXEL UNITS IN PRINCIPLE
POWER CONSUMPTION
HIGH
LOW
FIG. 2 and FIG. 3
PIXEL
FIG. 5
3: IMAGE PICKUP ELEMENT
6: IMAGE COMPRESSION UNIT
8: CODE AMOUNT CALCULATION UNIT
9: COMPRESSION RATIO DETERMINING UNIT
10: ENCODED STREAM STORAGE UNIT
11: AUXILIARY RATE CONTROL UNIT
FIG. 7
From above
PERIPHERAL CIRCUIT PART
PIXEL PART
SUBSTRATE SUPPORTING MATERIAL
FIG. 8
PIXEL
FIG. 9
From above
LOW FREQUENCIES (HORIZONTAL)
HIGH FREQUENCIES (HORIZONTAL)
LOW FREQUENCIES (HORIZONTAL)
HIGH FREQUENCIES (HORIZONTAL)
FIG. 10
ENCODE (QUANTIZATION AND ENTROPY CODING)
FIG. 11
COEFFICIENTS FOR LINE BUFFER
FIG. 14
From above
IMAGE PICKUP ELEMENT PART
PERIPHERAL CIRCUIT PART
FIG. 16
3: IMAGE PICKUP ELEMENT
6: IMAGE COMPRESSION UNIT
8: CODE AMOUNT CALCULATING UNIT
9: COMPRESSION RATIO DETERMINING UNIT
10: ENCODED STREAM STORAGE UNIT
11: AUXILIARY RATE CONTROL UNIT
82: RATE CONTROL UNIT
83: DRIVING CIRCUIT

The invention claimed is:

1. An image pickup device characterized by comprising:
image pickup means for outputting image pickup results by XY address control, said image pickup means including a plurality of photoelectric conversion units arranged in a form of a matrix; and
a peripheral circuit retained integrally with said image pickup means, said peripheral circuit being connected to said photoelectric conversion units by a wiring layer formed on a surface on an opposite side from a light receiving surface of said image pickup means,
the image pickup results of said image pickup means being processed and output by said peripheral circuit,
wherein said peripheral circuit includes image compressing means for data-compressing and outputting at least said image pickup results in each predetermined processing unit, and controlling means for controlling a data compression ratio of said image compressing means, said peripheral circuit is supplied with said image pickup results from said image pickup means in units of blocks formed by dividing an effective image area in a horizontal direction and a vertical direction, and sequentially data-compresses said image pickup results, and within one frame, on a basis of an amount of code generated by data compression of one block by said image compressing means, said peripheral circuit changes the data compression ratio when at least a next block is data-compressed by said image compressing means, and said image pickup means outputs the image pickup results of said photoelectric conversion units with said blocks as units in a sequence corresponding to the data compression by said image compressing means.

2. The image pickup device as claimed in claim 1, characterized by further comprising data amount correcting means for accumulating one frame of data output from said image compressing means and correcting data size.

3. The image pickup device as claimed in claim 1, characterized in that:
a data compressing process by said image compressing means is a data compressing process using a line-based wavelet transform process.

4. The image pickup device as claimed in claim 1, characterized in that:
a data compressing process by said image compressing means is a data compressing process using a tile-based wavelet transform process.

5. The image pickup device as claimed in claim 1, characterized in that:
a data compressing process by said image compressing means is a data compressing process using a discrete cosine transform process.

6. The image pickup device as claimed in claim 1, characterized in that:
said image compressing means converts said image data into coefficient data, subjects the coefficient data to a quantizing process and a coding process, and outputs a result, and the changing of the data compression ratio by said controlling means is changing of a quantization scale in said quantizing process.

7. The image pickup device as claimed in claim 1, characterized in that:
said peripheral circuit is disposed in a layer under said wiring layer.

8. The image pickup device as claimed in claim 7, characterized in that:
said peripheral circuit is formed by a wafer producing process different from a wafer producing process of said image pickup means.

9. An integrated circuit of an image pickup element characterized by comprising:
image pickup means for outputting image pickup results by XY address control, said image pickup means including a plurality of photoelectric conversion units arranged in a form of a matrix; and a peripheral circuit retained integrally with said image pickup means, said peripheral circuit being connected to said photoelectric conversion units by a wiring layer formed on a surface on an opposite side from a light receiving surface of said image pickup means, the image pickup results of said image pickup means being processed and output by said peripheral circuit, wherein said peripheral circuit includes
image compressing means for data-compressing and outputting at least said image pickup results in each predetermined processing unit, and controlling means for controlling a data compression ratio of said image compressing means, said peripheral circuit is supplied with said image pickup results from said image pickup means in units of blocks formed by dividing an effective image area in a horizontal direction and a vertical direction, and sequentially data-compresses said image pickup results, and within one frame, on a basis of an amount of code generated by data compression of one block by said image compressing means, said peripheral circuit changes the data compression ratio when at least a next block is data-compressed by said image compressing means, and said image pickup means outputs the image pickup results of said photoelectric conversion units with said blocks as units in a sequence corresponding to the data compression by said image compressing means.

10. An image pickup device characterized by comprising:
an image pickup section configured to output image pickup results by XY address control, said image pickup section including a plurality of photoelectric conversion units arranged in a form of a matrix; and a peripheral circuit retained integrally with said image pickup section, said peripheral circuit being connected to said photoelectric conversion units by a wiring layer formed on a surface on an opposite side from a light receiving surface of said image pickup section;

the image pickup results of said image pickup section being processed and output by said peripheral circuit, wherein said peripheral circuit includes
an image compressing section configured to data-compress and output at least said image pickup results in each predetermined processing unit, and a controlling section configured to control a data compression ratio of said image compressing section, said peripheral circuit is supplied with said image pickup results from said image pickup section in units of blocks formed by dividing an effective image area in a horizontal direction and a vertical direction, and sequentially data-compresses said image pickup results, and within one frame, on a basis of an amount of code generated by data compression of one block by said image compressing section, said peripheral circuit changes the data compression ratio when at least a next block is data-compressed by said image compressing section, and said image pickup section outputs the image pickup results of said photoelectric conversion units with said blocks as units in a sequence corresponding to the data compression by said image compressing section.

11. An integrated circuit of an image pickup element characterized by comprising:
an image pickup section configured to output image pickup results by XY address control, said image pickup section including a plurality of photoelectric conversion units arranged in a form of a matrix; and a peripheral circuit retained integrally with said image pickup section, said peripheral circuit being connected to said photoelectric conversion units by a wiring layer formed on a surface on an opposite side from a light receiving surface of said image pickup section;

the image pickup results of said image pickup section being processed and output by said peripheral circuit,
wherein said peripheral circuit includes
an image compressing section configured to data-compress and output at least said image pickup results in each predetermined processing unit, and
a controlling section configured to control a data compression ratio of said image compressing section,
said peripheral circuit is supplied with said image pickup results from said image pickup section in units of blocks formed by dividing an effective image area in a horizontal direction and a vertical direction, and sequentially data-compresses said image pickup results, and
within one frame, on a basis of an amount of code generated by data compression of one block by said image compressing section, said peripheral circuit changes the data compression ratio when at least a next block is data-compressed by said image compressing section, and
said image pickup section outputs the image pickup results of said photoelectric conversion units with said blocks as units in a sequence corresponding to the data compression by said image compressing section.

12. A method of processing image pickup results in an image pickup device, said image pickup device including image pickup means for outputting image pickup results by XY address control, said image pickup means including a plurality of photoelectric conversion units arranged in a form of a matrix, and a peripheral circuit retained integrally with said image pickup means, said peripheral circuit being connected to said photoelectric conversion units by a wiring layer formed on a surface on an opposite side from a light receiving surface of said image pickup means, the image pickup results of said image pickup means being processed and output by said peripheral circuit, said method characterized by comprising:
an image pickup result outputting step of outputting the image pickup results of said photoelectric conversion units from said image pickup means to said peripheral circuit;
an image compressing step of data-compressing and outputting at least said image pickup results in each predetermined processing unit by said peripheral circuit; and
a controlling step of controlling a data compression ratio of said image compressing step,
wherein in said image compressing step, said image pickup results are input from said image pickup means in units of blocks formed by dividing an effective image area in a horizontal direction and a vertical direction, and sequentially data-compressed,
in said controlling step, within one frame, on a basis of an amount of code generated by data compression of one block by said image compressing step, the data compression ratio when at least a next block is data-compressed by said image compressing step is changed, and
in said image pickup result outputting step, the image pickup results of said photoelectric conversion units are output with said blocks as units in a sequence corresponding to the data compression by said image compressing step.

13. A method of processing image pickup results in an integrated circuit of an image pickup element, said integrated circuit of the image pickup element including image pickup means for outputting image pickup results by XY address control, said image pickup means including a plurality of photoelectric conversion units arranged in a form of a matrix, and a peripheral circuit retained integrally with said image pickup means, said peripheral circuit being connected to said photoelectric conversion units by a wiring layer formed on a surface on an opposite side from a light receiving surface of said image pickup means, the image pickup results of said image pickup means being processed and output by said peripheral circuit, said method characterized by comprising:
an image pickup result outputting step of outputting the image pickup results of said photoelectric conversion units from said image pickup means to said peripheral circuit;
an image compressing step of data-compressing and outputting at least said image pickup results in each predetermined processing unit by said peripheral circuit; and
a controlling step of controlling a data compression ratio of said image compressing step,
wherein in said image compressing step, said image pickup results are input from said image pickup means in units of blocks formed by dividing an effective image area in a horizontal direction and a vertical direction, and sequentially data-compressed,
in said controlling step, within one frame, on a basis of an amount of code generated by data compression of one block by said image compressing step, the data compression ratio when at least a next block is data-compressed by said image compressing step is changed, and
in said image pickup result outputting step, the image pickup results of said photoelectric conversion units are output with said blocks as units in a sequence corresponding to the data compression by said image compressing step.

14. The image pickup device as claimed in claim 1, wherein said blocks are assigned a period for outputting the image pickup results based on the order in which the blocks were formed, and wherein said image pickup means outputs the image pickup results based on the period.

15. The image pickup device as claimed in claim 1, wherein said effective image area is divided into a predetermined number of said blocks.

16. The image pickup device as claimed in claim 1, wherein said peripheral circuit changes the data compression ratio based on a difference between a target code amount and the amount of code generated, the target code amount being obtained by an amount of code assigned to the one frame by a total number of blocks per frame.

17. The image pickup device as claimed in claim 1, wherein said blocks are rectangular.

* * * * *